United States Patent
Yamanaka

(10) Patent No.: US 6,580,653 B2
(45) Date of Patent: Jun. 17, 2003

(54) CURRENT SAVING SEMICONDUCTOR MEMORY AND METHOD

(75) Inventor: Toshiki Yamanaka, Ikeda (JP)

(73) Assignee: Ricoh Company Ltd., Tokyo (JP)

( * ) Notice: Subject to any disclaimer, the term of this patent is extended or adjusted under 35 U.S.C. 154(b) by 0 days.

(21) Appl. No.: 10/079,436

(22) Filed: Feb. 19, 2002

(65) Prior Publication Data

US 2002/0159309 A1 Oct. 31, 2002

(30) Foreign Application Priority Data

Feb. 19, 2001 (JP) .................................... 2001-041185
Mar. 5, 2001 (JP) .................................... 2001-060172

(51) Int. Cl.⁷ ................................................ G11C 7/02
(52) U.S. Cl. ...................... 365/210; 365/203; 365/205
(58) Field of Search .......................... 365/210, 203, 365/205, 207, 233, 189.05, 230.08

(56) References Cited

U.S. PATENT DOCUMENTS 6,310,810 B1 * 10/2001 Jain .......................... 365/205

FOREIGN PATENT DOCUMENTS

JP 8273365 10/1996

* cited by examiner

Primary Examiner—David Lam
(74) Attorney, Agent, or Firm—Cooper & Dunham, LLP.

(57) ABSTRACT

A semiconductor memory includes a dummy memory circuit configured to simulate dummy data reading from an applicable dummy memory cell when data reading is performed. The dummy memory circuit may include a plurality of dummy memory cells each selected together with a corresponding memory cell for reading. The dummy memory cell may include pre-fixed complementary data. A dummy bit line pair may be connected to each of the plurality the dummy memory cells. A dummy pre-charge circuit may be provided so as to pre-charge the dummy bit line pair when data reading is performed. A dummy sense amplifier may be provided so as to amplify a potential difference of the dummy bit line pair. The dummy sense amplifier may output a control signal for controlling the semiconductor memory when the potential difference is at a prescribed level.

12 Claims, 21 Drawing Sheets

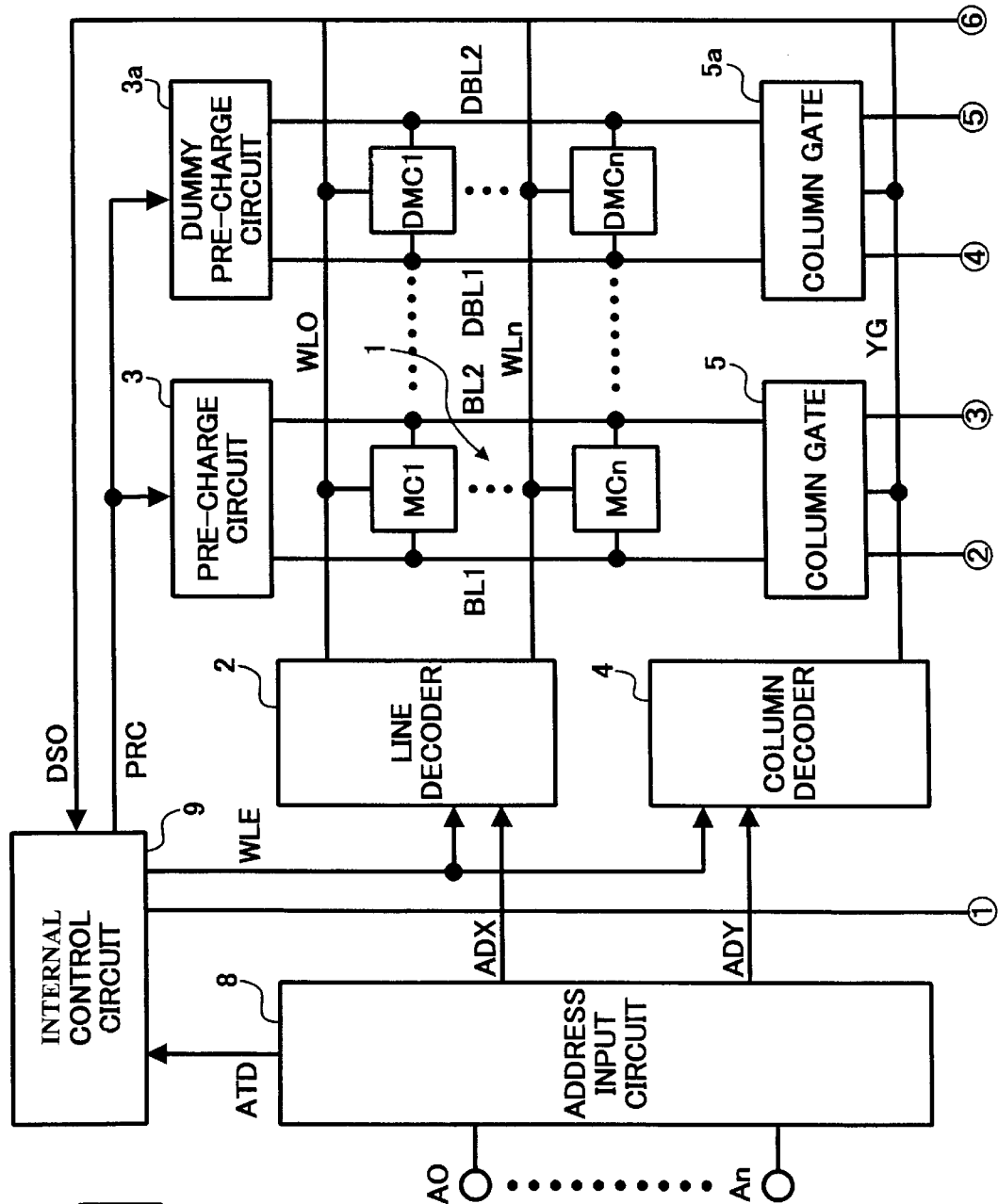

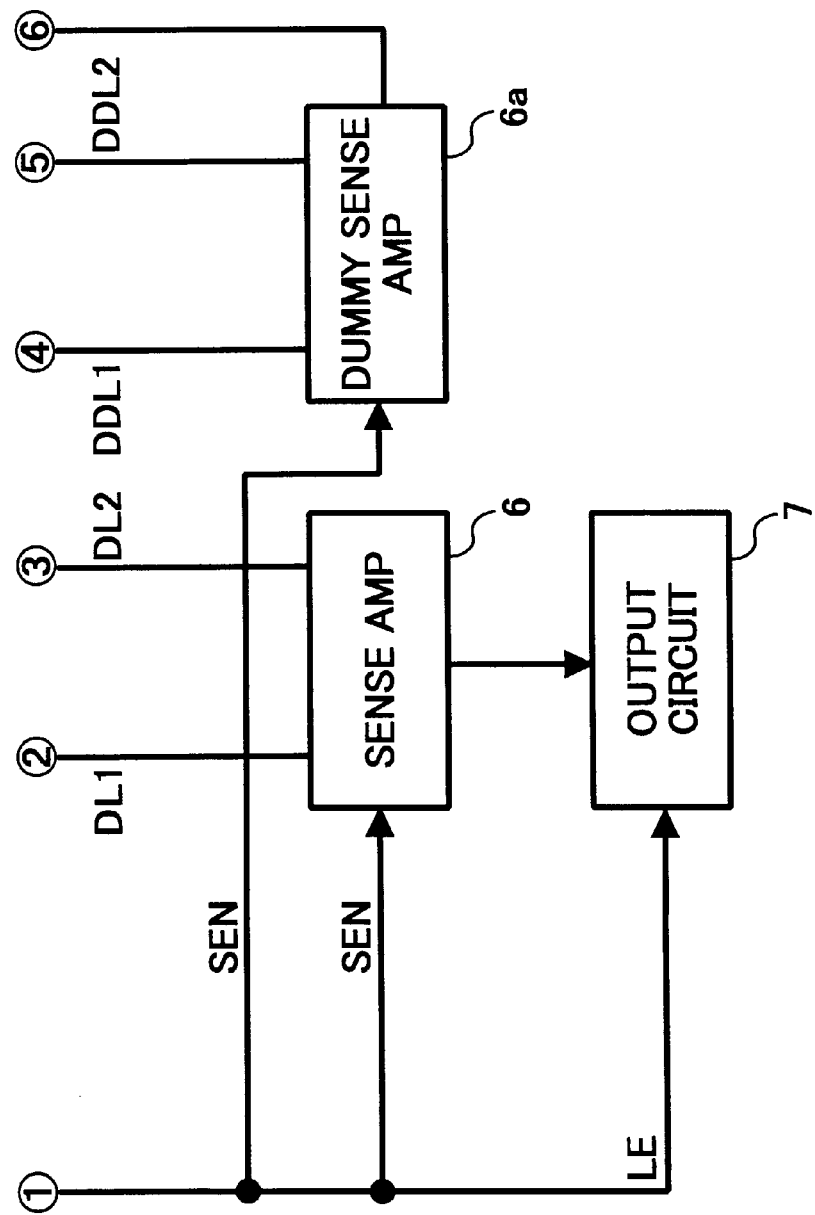

CURRENT SAVING SEMICONDUCTOR MEMORY AND METHOD

FIELD

This patent specification generally relates to semiconductor memory devices such as static RAMs (Random Access Memory), and more particularly to circuits capable of saving current, and semiconductor memory devices capable of giving operation assurance by adjusting an activation timing of a sense amplifier or a word line using a dummy memory circuit.

BACKGROUND

As a current saving system, it is known that a prescribed circuit can perform autogenous control by simulating a dummy operation in a semiconductor memory device A dummy memory circuit is a typical example of such a circuit, and changes an internal activation signal to a deactivation condition after simulating reading from an applicable (dummy) memory cell and detecting that the reading has been completed.

After a prescribed memory cell is selected and reading of data therefrom is started, the data is carried to a sense amplifier via an applicable bit line pair, and a slight potential difference existing therebetween is amplified there. An output from the sense amplifier is finally output from an output circuit. Since the output circuit generally includes a prescribed latching circuit capable of latching data, the sense amplifier need not remain activated after the output is latched.

A dummy memory circuit is frequently employed so as to monitor the output condition of a sense amplifier, and control a timing to latch the output therefrom and the sense amplifier activation.

In addition, when data is read, the potential charged to a bit line need not go to a level greater than that the sense amplifier can detect. Full swing of the change in the potential of the bit line is generally suppressed by controlling an applicable word line, again with a dummy circuit.

When performing control with a dummy memory circuit, activation of a sense amplifier and a word line should be controlled after confirming absolute output from a sense amplifier.

However, if an operation margin is excessive, a memory circuit may exhibit low performance characteristics. In contrast, if a timing of changing to a deactivation condition is too early, data output might be erroneous. Thus, a certain amount of operation margin should be generally utilized.

Further, a circuit should output correct data even under unforeseeable conditions such as variations in performance of a sense amplifier and a memory cell, variations of capacity or resistance of a bit line, etc., caused by manufacturing variations. In addition, since current is consumed in a control circuit itself, a system capable of securing an operation margin as readily as possible is generally preferable.

A dummy circuit is typically located far from a word line driver, and a prescribed system is provided so as to attempt to secure the operation margin. For example, Japanese Patent Application laid Open No. 8-273365 refers to a system in which an operation margin in operation timings for controlling activation of a sense amplifier and an output latching circuit is secured by a dummy memory cell located in the remotest end of a word line. Specifically, such an operation margin is secured by increasing a parasitic capacity (of a bit line) by increasing a line width of a dummy bit line pair and reducing its line interval. As an alternative, downsizing of a driving capability of the dummy memory cell is also proposed therein.

However, since the operation margin created by the above-described system is secured by changing the performance of the dummy cell and dummy bit line, the operation margin varies with process variations and a change in power supply voltage.

Further, an asynchronous type semiconductor memory capable of activating each section in response to an input of address data generally has no time for enabling a pre-charge circuit to pre-charge a memory cell array, unlike a synchronous type semiconductor memory capable of activating respective sections in accordance with a change in a signal level of a clock signal. Thus, the asynchronous type semiconductor memory should preserve a pre-charge time period using a pre-charge control signal "PRC". In such a situation, if the pre-charge time period is too short, previous data remains in a bit line and disturbs reading of new data. In contrast, if the pre-charge time period is too long, data reading is delayed. Accordingly, optimizing the pre-charge time period can improve operational performance.

Thus, such a pre-charge time period just after data writing is an objective to be improved. Since a potential difference between a bit line pair is greatest in a data writing condition (i.e., a full-swing condition), a pre-charge time period "t" for the subsequent reading should be made longer. Each entire pre-charge time period is generally set on the basis of the time period "t". However, there exists a problem in such a system that the pre-charge time period is too long for a data reading cycle. In addition, a pre-charge time period can not easily adapt to a change in memory size. Accordingly, a particular pre-charge time period should be designed for a particular memory size. Otherwise, the pre-charge time period should include a margin capable of accommodating a variety of memory sizes.

There exists a system having a dummy memory circuit capable of adjusting a pre-charge time period. The system employs a detection circuit capable of detecting a pre-charge condition of a bit line of the dummy memory circuit, and controls a pre-charge circuit to activate in accordance with a pre-charge condition detected by the detection circuit. Meaningless pre-charge is omitted during a data reading cycle, and a memory size change can be accommodated. However, a pre-charge condition just after data writing can not be easily followed and improved.

Since it is generally a main purpose of utilizing a dummy memory circuit to save current upon data reading, a dummy memory circuit does not include a (dummy) write buffer for data reading. Thus, upon a data writing condition, a bit line pair BL1 and BL1B exponentially is brought to a full-swing condition by a write buffer comprising a transistor having a large gate size as illustrated in FIG. 12. In contrast, a dummy bit line pair DBL and DBLB represents a small change in a potential difference as in the data reading condition.

Thus, when data writing is immediately followed by data reading from another storage location in a memory, such as in a high speed SRAM, whose data reading and writing cycles are short, there exists a difference between a first potential difference between a bit line pair, and a second potential difference between a dummy bit line pair. As a result, a pre-charge time period can not sufficiently be monitored, and data of the memory cell is sometimes destroyed or data is erroneously read.

SUMMARY

Accordingly, an object of the system and method disclosed herein is to address and resolve the above and other problems and provide a new semiconductor memory that includes a dummy memory circuit configured to simulate dummy data reading from an applicable dummy memory cell when data reading is performed. The dummy memory circuit may include a plurality of dummy memory cells each selected together with a corresponding memory cell for reading. The dummy memory cell may include prefixed complementary data. A dummy bit line pair may be connected to each of the plurality dummy memory cells. A dummy pre-charge circuit may be provided so as to pre-charge the dummy bit line pair when data reading is performed. A dummy sense amplifier may be provided so as to amplify a potential difference between the dummy bit line pair. The dummy sense amplifier may output a control signal for controlling the semiconductor memory when the potential difference is at a prescribed level. The dummy pre-charge circuit may provide the dummy bit line pair with respective charge amounts oppositely corresponding to the complementary data when data reading is performed.

BRIEF DESCRIPTION OF DRAWINGS

A more complete appreciation of the disclosed embodiments and many of the attendant advantages thereof will be readily obtained as the same becomes better understood by reference to the following detailed description when considered in connection with the accompanying drawings, wherein:

FIGS. 1A and 1B are block diagrams for illustrating an exemplary construction of a first preferred embodiment of a semiconductor memory;

DETAILED DESCRIPTION OF PREFERRED EMBODIMENTS

Figure 2:
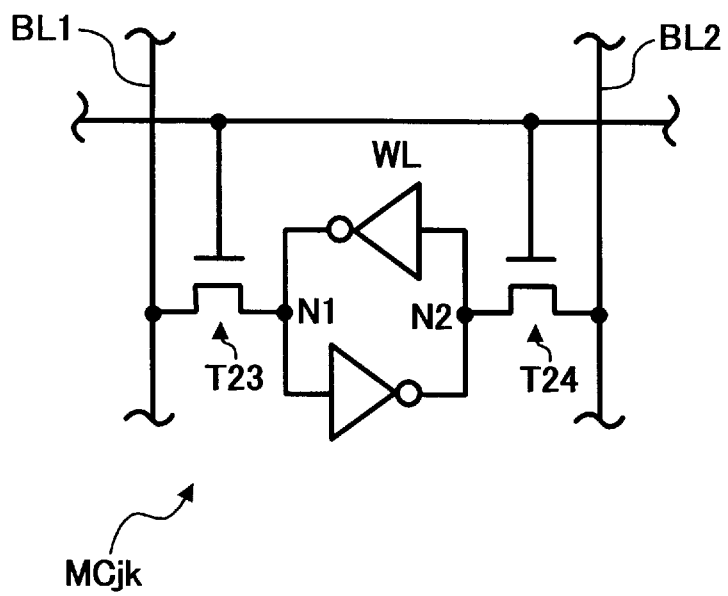
FIG. 2 illustrates a circuit of a memory cell of a semiconductor memory according to a preferred embodiment.

Referring now to the drawings, wherein like reference numerals designate identical or corresponding parts throughout several views, in particular in FIGS. 1A and 1B, a semiconductor memory may include a plurality of memory cell arrays 1. The memory cell array 1 may include a plurality of memory cells (MC1~MCn . . . ) having respective pairs of first and second data input/output terminals and capable of writing, storing, and reading data of complementary levels via these terminals, both in line and column directions. Only one line of the memory cells is illustrated in the column direction in FIG. 1 for the sake of convenience. In practice, a line of the memory cells may be arranged in each of a plurality of columns.

A plurality of word lines (WL0~WLn) may be arranged in respective lines of a plurality of memory cells, so as to bring memory cells in an applicable line into prescribed selected levels. In respective columns of the memory cells, a plurality of bit line pairs may be provided, respectively. Each of the plurality of bit line pairs may include first and second bit lines (BL1, BL2) respectively connected to the first and second data input/output terminals of a memory cell in an applicable column.

In response to an address signal ADX of a logical high level given by an address input circuit 8, a line address decoder 2 may bring a prescribed word line among the plurality of word lines WL1 to WLn to a selected level (e.g. high level) in accordance with the line address signal ADX, when a word line activation signal WLE is at an activation level. A pre-charge circuit 3 may be provided so as to pre-charge an applicable bit line pair at a prescribed potential in response to an activation level of a pre-charge control signal PRC given by an internal control circuit 9.

In addition, a column address signal ADY may be given to a column address decoder 4 from the address input circuit 8. The column address decoder 4 may control a column gate circuit 5 in accordance with the column address signal ADY, and select a prescribed bit line pair among the plurality of bit line pairs. A sense amplifier 6 may amplify and output data of the bit line pair selected by the column address decoder 4 when a sense amplifying activation signal SEN in at an activation level. An output circuit 7 may latch and then output such data of the sense amplifier 6 when a data latch signal LE is in at an activation level.

The above-described address input circuit 8 may detect a change in an address value of an address signal including a line address signal ADX and a column address signal ADY and output an address transition detection signal ATD. The internal control circuit 9 may output each of a word line activation signal WLE, a sense amplifying activation signal SEN, a data latch signal LE, and a pre-charge control signal PRC in response to the ATD at prescribed various timings for prescribed periods of time at activation levels.

In addition, a plurality of dummy memory cells (DMC1~DMCn) may be provided at the remotest end from the respective line address decoder 2 and connected to the plurality of word lines, respectively. Each of the dummy memory cells may include fixed data of complement levels (e.g. high and low levels) and first and second data output terminals. These data may be read from the dummy memory cell via output terminals, respectively, in a case of a selected level of an applicable word line.

To the first data output terminal of each of the dummy memory cells, the first dummy bit line DBL 1 may be connected. Similarly, the second dummy bit line DBL 2 may be connected to the second data output terminal of each of the dummy memory cells. A dummy sense amplifier 6a may output a pair of data levels (i.e., high and low) of the dummy bit line pair oppositely corresponding to pre-charge potential levels of the dummy bit line pair when a sense amplifier activation signal SEN is at an activation level.

A dummy pre-charge circuit 3a may pre-charge a dummy bit line pair to a prescribed level corresponding to a pre-charge level of the dummy bit line pair in response to the sense amplifying activation signal SEN transmitted from the internal control circuit 9.

Each of the memory cells may include a memory section having fist and second flip-flop type memory nodes (N1, N2) as illustrated in FIG. 2. Each of the memory cells may also include a pair of transistors (T23, T24) serving as switches that are turned ON when a word line WLj (j=1~n) connected to respective gates is in a selected level and correspondingly connects the memory nodes N1 and N2 to the fist and second bit lines BLk1 and BLk2) (k=1, 2, . . . ).

Figure 3:
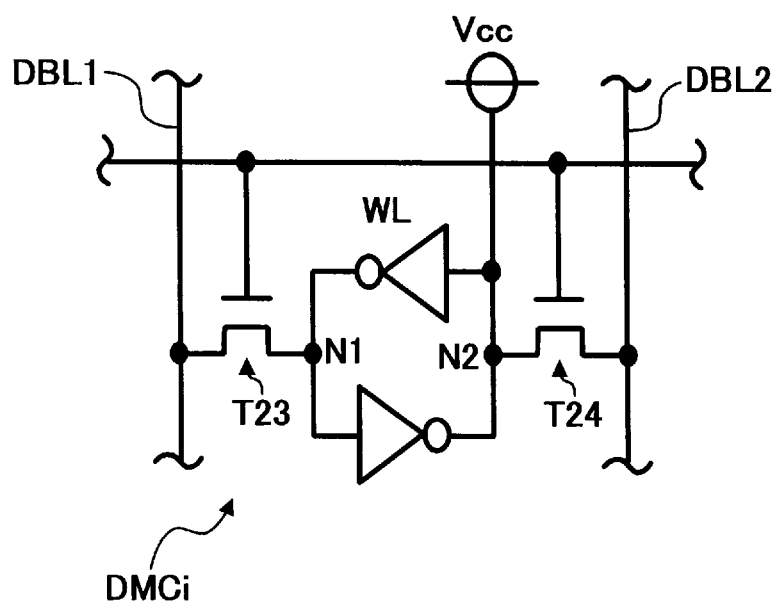
FIG. 3 illustrates a dummy memory cell of a semiconductor memory according to a preferred embodiment.

Similarly, each of the dummy memory cells (DMC1~DMCn) may include a memory section having fist and second flip-flop type memory nodes N1 and N2 as illustrated in FIG. 3. Each of the dummy memory cells may also include a pair of transistors T23 and T24 serving as switches that are turned ON when a word line WLj (j=1~n) connected to respective gates is at a selected level (i.e., high level) and correspondingly connects the memory nodes N1 and N2 to the fist and second dummy bit line pair DBL1 and DBL2). In addition, a potential Vcc of an electric power supply may be applied to the memory node N2 and a potential "L" may be previously fixed so as to be read from the DBL1 side.

As described above, the memory cells (MC11~MC1n) and dummy memory cells (DMC1~DMCn) may be connected to the same word lines WLj (j=1~n), respectively, and synchronously selected.

When the dummy sense amplifier 6a detects a prescribed signal from a dummy bit line pair (DBL1, DBL2), the internal control circuit 9 may control the sense amplifier 6 to change to a deactivation condition from an activation condition by determining that an output from the bit line pair also is definite (i.e., fixed) in the main (i.e., not dummy) sense amplifier. Similarly, an applicable word line WLj (j=1~n) may also be changed into a non-selected level. Thus, consumption of a current flowing through the sense amplifier 6 and charge/discharge current flowing through the bit line pair (BLk1, Blk2) can be suppressed so as not to exceed a level required upon data reading.

Figure 4:
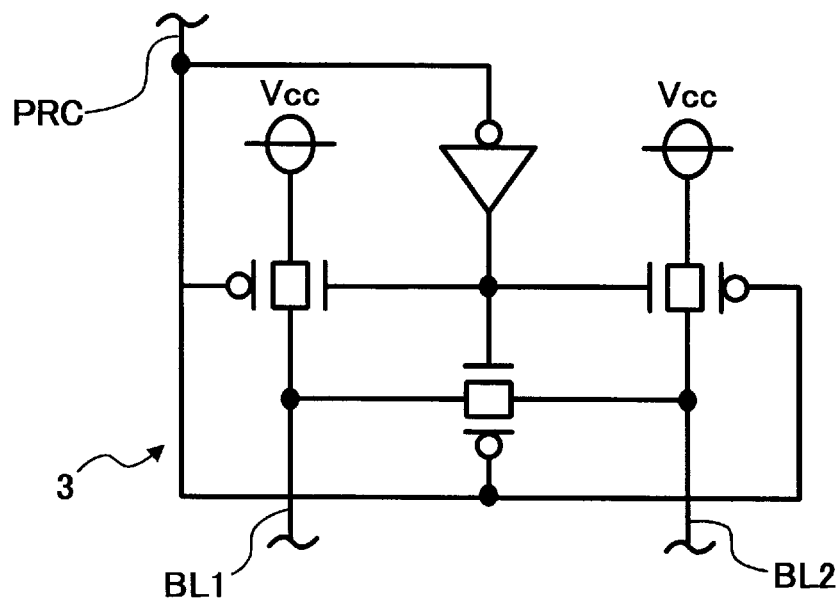
FIG. 4 illustrates a pre-charge circuit of a semiconductor memory according to a preferred embodiment.
Figure 5:
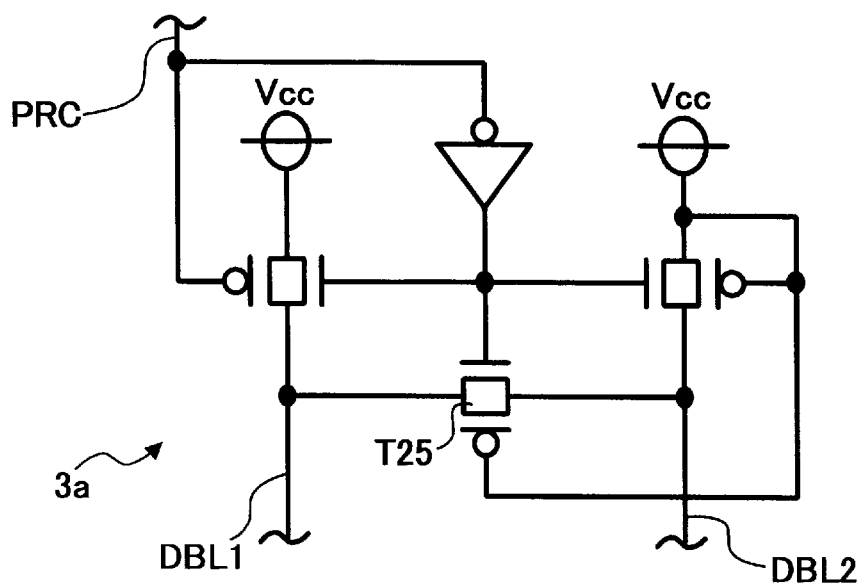
FIG. 5 illustrates a first example of a dummy pre-charge circuit of a semiconductor memory according to a preferred embodiment.

The pre-charge circuit 3 and dummy pre-charge circuit 3a are now described in more detail with reference to FIGS. 4 and 5. The pre-charge circuit 3 of the main side may include a pair of PMOS transistors so as to pre-charge of the bit line pair to a level of an electrical power supply potential Vcc as illustrated in FIG. 4. In order to increase pre-charge speed after a write mode, pre-charge with a NMOS transistor may also be performed.

The dummy circuit side may be similar. However, a potential of the dummy bit line DBL 2 side connected to a potential "H" level fixed side of the dummy memory cell 3a may be set lower than the electrical power supply potential Vcc by a prescribed value as illustrated in FIG. 5. Specifically, only a NMOS transistor as shown may perform pre-charge so as not to raise the potential to a level obtained by subtracting a threshold potential Vthn of the NMOS transistor from the electrical power supply potential Vcc (i.e., Vcc–Vthn). Thus, a relation "DBL1>DBL2" may be established as the pre-charge condition. In this way, a prescribed potential difference may be generated between the dummy bit line pair in opposite relation to data previously given to a dummy memory cell.

In a case of reading an output potential "L" from the dummy bit line DBL 1 side, an output from the dummy sense amplifier 6a, which generates the output when there exists a prescribed difference in a pre-charge potential between the dummy bit line pairs, may be relatively delayed when compared with a normal case in which the same pre-charge potentials are applied to respective dummy bit line pairs. That is, time elapsing in this case from the time when discharge is started at the low side and the time when the prescribed potential difference exists between dummy bit line pairs may be longer than that in the normal case. In other words, if the DBL1 that is the low side of the dummy memory cell and is pre-charged to a level of 5V, and the DBL2 that is the high side thereof and is pre-charged to that of 4V, and the prescribed potential difference is 2 v, for example, the discharge is started from 5 v and terminated at 3 v, and thereby the output is generated from the dummy sense amplifier. The pre-charge potential 4 v of the high side is not discharged and the potential difference of 2 v is obtained when DBL1 is at 3V. Thus, time elapsing from 5V to 3V of the DBL1 is longer than that when the pair of dummy bit line pair receive the same pre-charge potential, for example, 4V and the potential of the DBL1 becomes to 2V. If this delay is used as an operation margin for a change in characteristic caused by manufacturing variations, it may not be needed to add a special additional circuit for controlling timing. Also, assurance for a change in a memory size may be realized by following the change with a prescribed operation margin.

Figure 6:
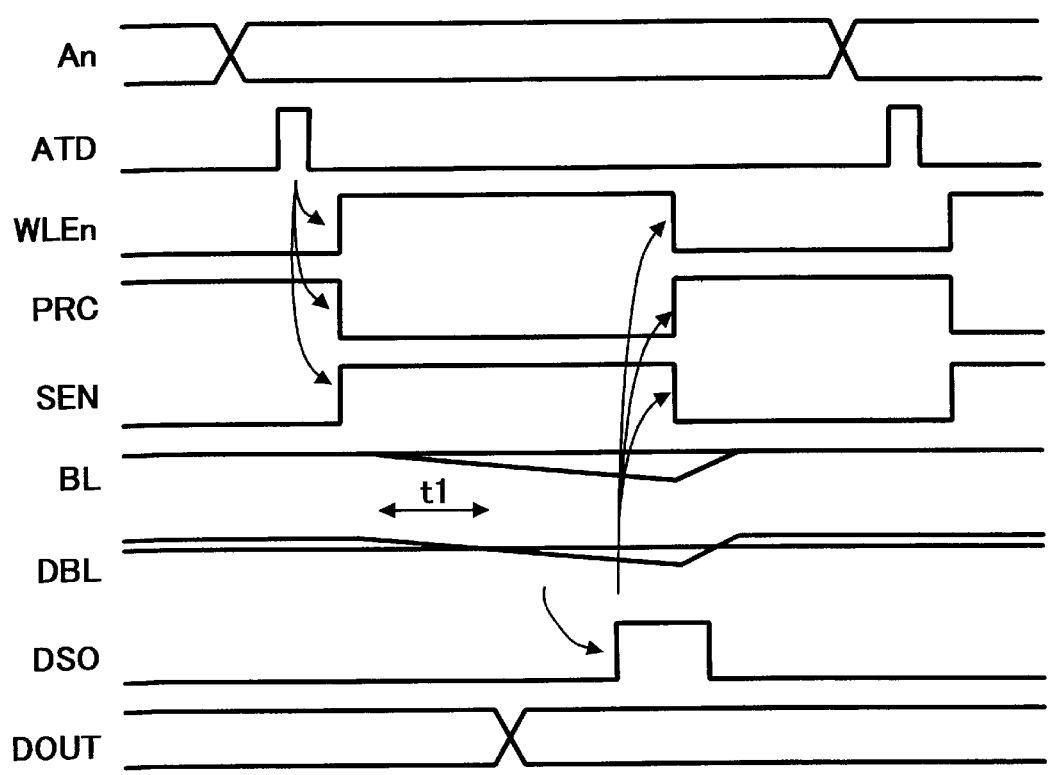
FIG. 6 illustrates timing of respective sections of the semiconductor memory illustrated in FIGS. 1a and 1b.

FIG. 6 may represent a timing chart for illustrating an operation of a first embodiment. In response to a change in an address, an address input circuit 8 may give a transition signal ATD to the internal control circuit 9. The internal control circuit 9 may be activated and start an internal operation. Respective signals "PRC, WLE, SEN" may change, and a reading condition may be established. Simultaneously, the dummy circuit side may also enter a reading condition. Reading of the entire bit line pair BL1 and BL2, and the dummy bit line DBL1, may be performed from a condition pre-charged to the electrical power supply potential Vcc. However, only reading from the dummy bit line DBL2 may be performed from a level lower than the Vcc by a prescribed potential. Thus, an output from the dummy sense amplifier 6a may be delayed by a prescribed time period (e.g. "t1" in the timing chart).

If this delay is utilized in every type of circuit having a variety of memory sizes, an operation having a prescribed operation margin can be assured.

In an initial condition of a write mode before a reading mode, the dummy bit line DBL2 may be pulled down to a potential of the DBL1 side by an equalize transistor T25 shown in the dummy pre-charge circuit 3a. Thus, it (the dummy bit line DBL2) may be readily brought to a medium potential of (Vcc−Tthn).

Figure 7:
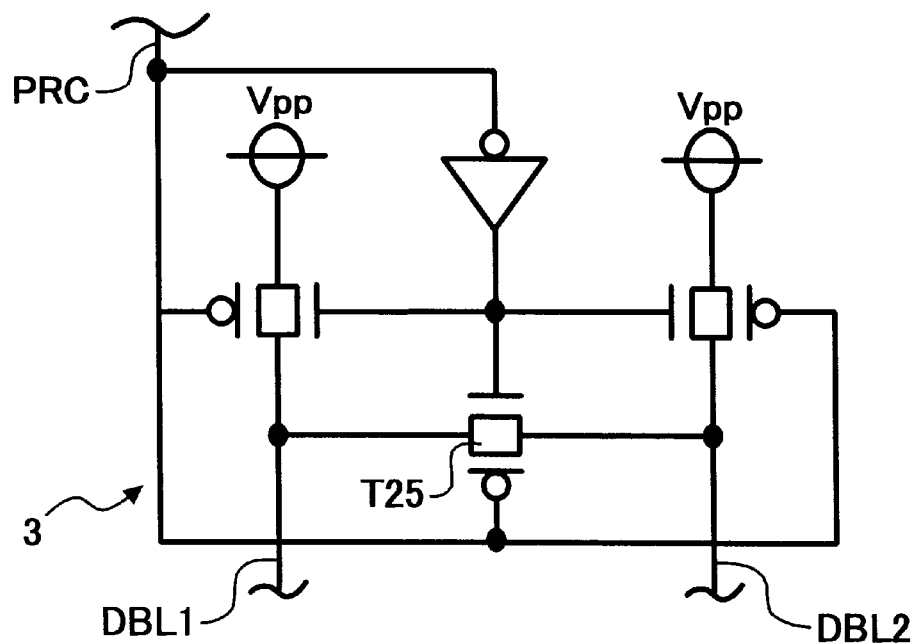
FIG. 7 illustrates another dummy pre-charge circuit according to a preferred embodiment.
Figure 8A:
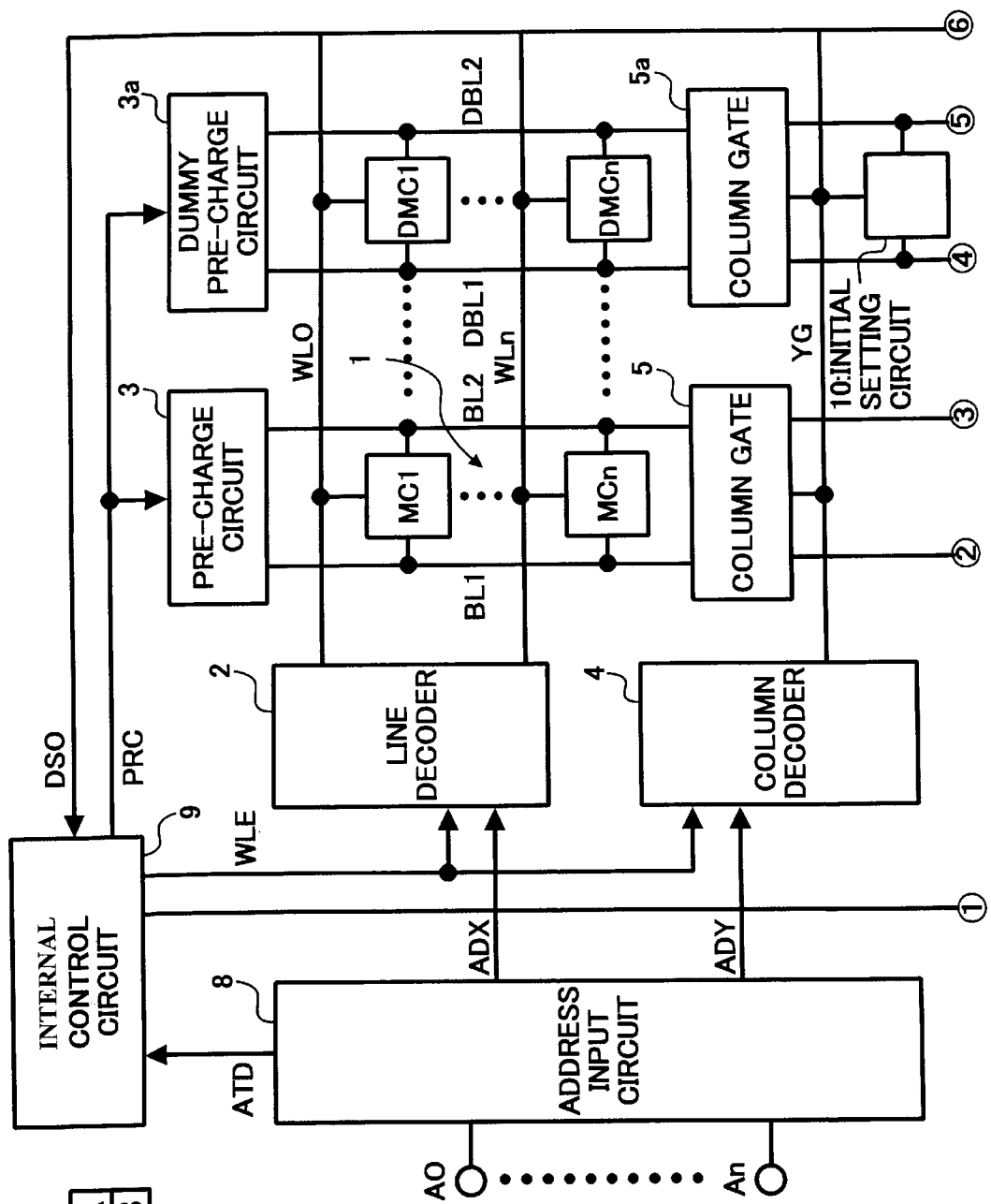
FIGS. 8A and 8B illustrate an exemplary second preferred embodiment of a semiconductor memory.
Figure 8B:
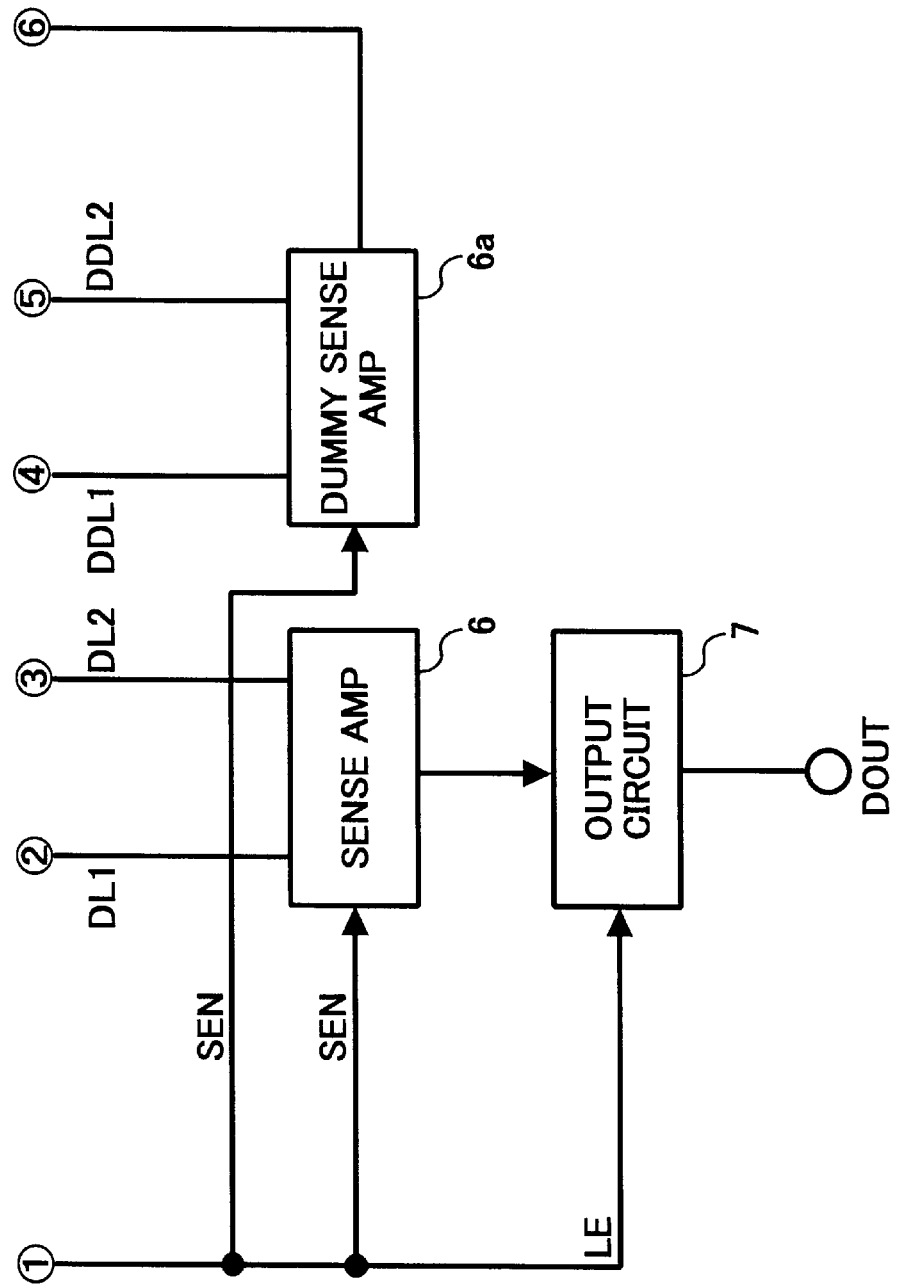

As mentioned above, it may be sufficient that the dummy lines are pre-charged so that a potential of DBL1 is greater than that of DBL2 in the pre-charge condition. Thus, if the dummy pre-charge circuit is similar to the main pre-charge circuit as illustrated in FIG. 7, and a potential "Vpp" higher than the electrical power supply potential (Vcc) is applied to the dummy bit line DBL1, substantially the same effect can be obtained. When a memory such as EEPROM is utilized, a potential for writing may be utilized as the higher potential Vpp. However, since a higher potential is utilized, more electric power may be consumed in such a situation than in the construction of FIG. 5.

A second example is now described with reference to FIGS. 8A to 12. For several devices identical to those illustrated in FIG. 1, identical legends will be correspondingly assigned. Repetitious explanation may be omitted hereinbelow for simplicity. In this respect, FIGS. 8A and 8B may illustrate another construction and method.

A dummy pre-charge circuit 3 in this embodiment may also include substantially the same construction as the pre-charge circuit of the main side. As a system for lowering a potential of the dummy bit line DBL2, an initial condition setting circuit 10 may be provided.

A construction thereof may be described with reference to FIGS. 9 to 11.

Figure 9:
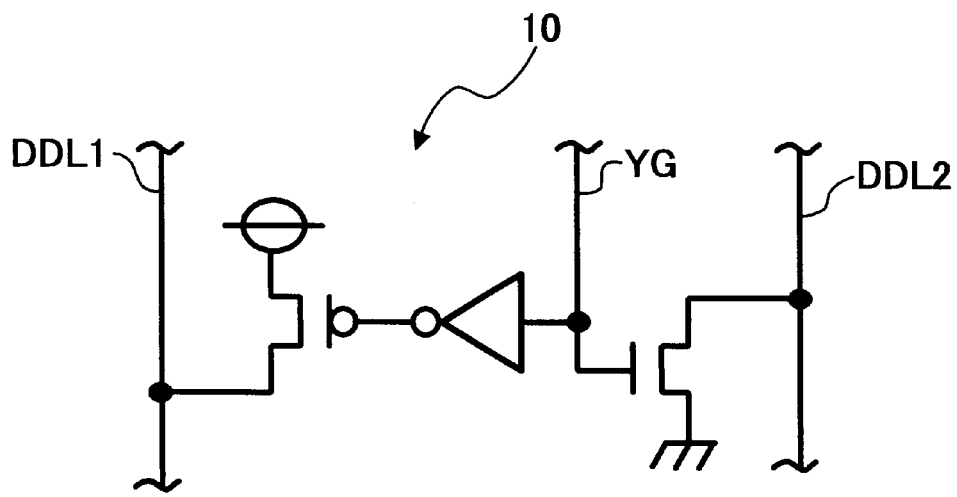
FIG. 9 illustrates an exemplary dummy data line initial setting circuit of the second embodiment.

As noted from FIG. 9, the initial condition setting circuit 10 may be provided between a dummy data line pair DDL1 and DDL2. The DDL2 may have an initial potential "L" because a transistor shown therein is grounded. In such a condition, when a column gate activation signal (YG) is turned ON and input to the gate of the transistor, electric charge of the dummy bit line DBL2 may be moved to the DDL2 side. Simultaneously, the potential of the DBL2 may be lowered by a prescribed value because of sharing of the potential. By using such a change in a potential, an operation similar to that described in the first embodiment may be enabled while securing a prescribed operation margin.

Figure 10:
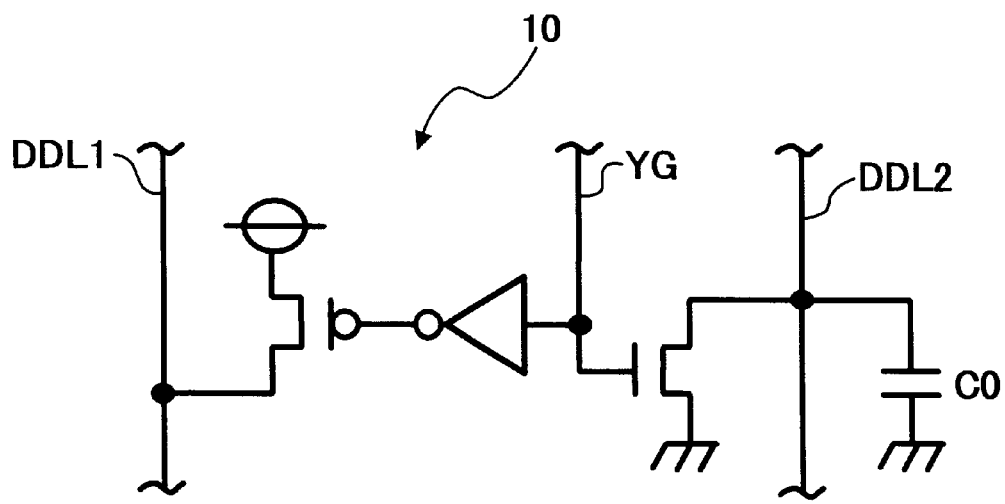
FIG. 10 illustrates another dummy data line initial setting circuit.
Figure 11:
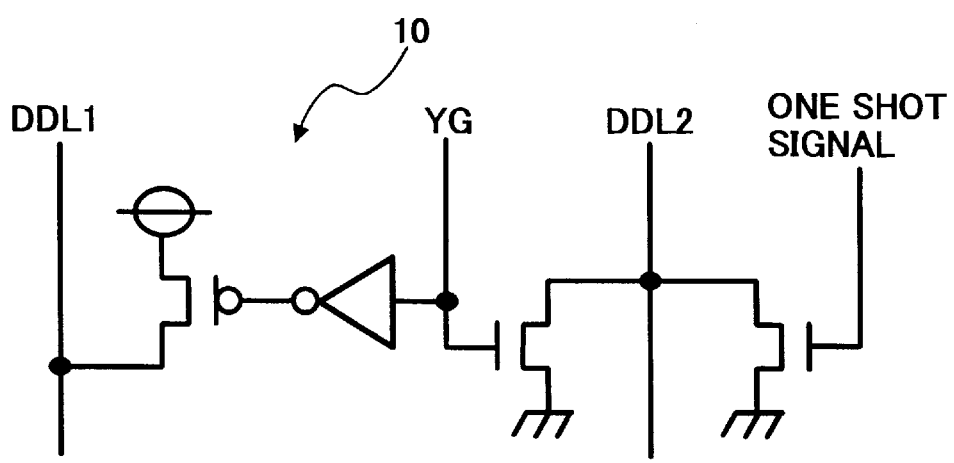
FIG. 11 illustrates still another exemplary dummy data line initial setting circuit.

In addition, if parasitic capacity "CO" is preferably connected to the dummy data line DDL2 as illustrated in FIG. 10, an amount of movement of electric charge from the DBL2 to the dummy data line DDL2 can be adjusted. In other words, an output timing of a signal (i.e., DSO) from the sense amplifier can also be adjusted. A modified system may be illustrated in FIG. 11. The system may pull down a potential of the DDL2 a prescribed period of time just after a column gate is activated by inputting a one shot pulse generated by a YG signal to a gate of a transistor. The circuits illustrated in FIGS. 9 to 11 may be substantially the same with respect to obtaining an operation margin by delaying an output signal (DSO) from a dummy amplifier. Similar effect may be obtained if substantially the same circuit illustrated in FIG. 11 is connected to the DBL2 and temporary pulling the potential thereof down.

Figure 12:
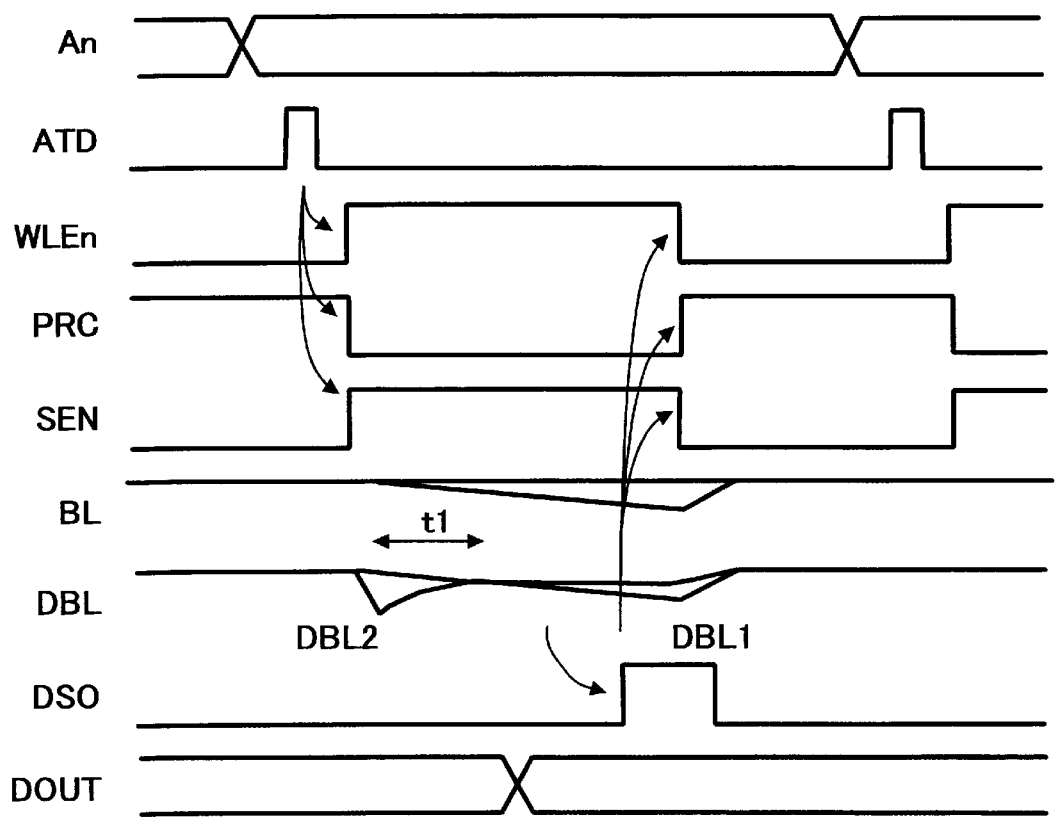
FIG. 12 illustrates timing in the semiconductor memory apparatus of FIGS. 8A and 8B.

FIG. 12 illustrates a timing chart for illustrating various operations of the second embodiment. In response to a change in an address, the address input circuit 8 may give a transition signal ATD to the internal control circuit 9. Then, the internal control circuit 9 may be activated and starts an internal operation. Respective signals of "PRC", "WLE", and "SEN" may change and a reading condition may be entered. Simultaneously, the dummy side may also enter a reading condition. Reading the bit lines BL1 and BL2, as well as the dummy bit lines DBL1 and DBL2 may be performed from conditions pre-charged to the electric power supply voltage "Vcc". However, when a column gate activation signal (YG) is turned ON, electric charge on the DBL2 may move to the DDL2 side, and the potential of the DDL2 may be lowered by a prescribed value. Thus, the output from the dummy sense amplifier 6a may be delayed by a prescribed time period (i.e., corresponding to "t1" in the chart).

A third embodiment is now described with reference to FIGS. 13 to 24. FIG. 13 is a block diagram for illustrating an exemplary configuration of a semiconductor memory of this embodiment. As noted from FIG. 13, a memory cell array comprising one line of memory cells may be illustrated as an example for the purpose of easy comprehension.

The semiconductor memory 1 may include an address input circuit 2 to which address data A0~An are externally input, a line decoder 3 that controls word lines WL0~WLm (m represents a natural number) to activate, and a column decoder 4. Also included may be a memory cell array 5 comprising memory cells MC each having (m+1) lines of SRAMs per column. The semiconductor memory apparatus 1 may include a pre-charge circuit 6 that pre-charges a bit line pair of the memory array 5, and a column gate 7 that connects an applicable bit line pair of the memory cell array 5 to a data line pair DL and DLB, respectively.

The semiconductor memory 1 may also include a sense amplifier 8 to which read data is input via the data line pair DL and DLB, an input/output circuit 9 that outputs a data signal, which is output from the sense amplifier 8, through an output terminal DOUT, and a write buffer 10 that outputs write data, which is input from an input terminal DIN via the input/output circuit 9, to the data line pair DL and DLB. Also included may be the line decoder 3, the column decoder 4, a pre-charge circuit 6, a sense amplifier 8, an input/output circuit 9 and an internal control circuit 11 that controls the write buffer 10 to activate. The memory cell array 5, the pre-charge circuit 6, the column gate 7, the sense amplifier 8, and the write buffer 10 may collectively constitute a memory circuit section 12.

In addition, the semiconductor memory 1 may also include a dummy memory cell array 13 comprising dummy memory cells DMC of a plurality of SRAMs, a dummy pre-charge circuit 14 that pre-charges the dummy bit line pair DBL and DBLB of the dummy memory cell array 13, and a dummy column gate 15 that connects the dummy bit line pair DBL and DBLB to a dummy data line pair DDL and DDLB.

Also included may be a dummy sense amplifier 16 to which read data are input via the dummy data line pair DDL and DDLB, a dummy write buffer 17 that outputs prescribed write data to the dummy data line pair DD1 and DDLB, and a detection circuit 18 that detects and outputs a voltage of the dummy bit line DBL to the internal control circuit 11. The dummy memory cell array 13, the dummy pre-charge circuit 14, the dummy column gate 15, the dummy sense amplifier 16, and the dummy write buffer 17 may collectively form a dummy memory circuit section 19. The internal control circuit 11 may constitute a control section. The detection circuit 18 may constitute a detection circuit section.

The dummy memory cell array 13 may be formed in a similar configuration to the one line of the memory cells of the memory cell array 5. Specifically, the dummy memory cell array 13 may comprise by (m+1) dummy memory cells DMC correspondingly connected to respective word lines WL0~WLm. Further, an inverter may form the detection circuit 18. An inverter may form the detection circuit 18. Input and output terminals of the inverter may be connected to the dummy bit line DBL and the internal control circuit 11, respectively.

The detection circuit 18 may detect a voltage of the dummy bit line DBL in response to a prescribed signal. A two-input type NAND circuit may desirably form the detection circuit 18. In such a case, one of input terminals and an output terminal of the NAND circuit may be connected to the dummy bit line DBL and the internal control circuit 11, respectively. A prescribed control signal may be input to the other input terminal. Then, a signal may be output in accordance with a voltage of the dummy bit line DBL in response to a control signal.

When external address data A0~An are input, the address input circuit 2 may output these data as well as a prescribed signal ATD indicating that these address data have been input to the respective line decoder 3 and column decoder 4, and the internal control circuit 11, respectively.

Upon receiving the prescribed signal ATD, the internal control circuit 11 may output a pre-charge control signal PRC having a high level and enable the pre-charge circuit 6 and the dummy pre-charge circuit 14 to perform pre-charge operations. The internal control circuit 11 may simultaneously monitor a voltage induced on the dummy bit line DBL and input from the detection circuit 18. Due to activation of the pre-charge circuit 6 and the dummy pre-charge circuit 14, the bit line pairs in the memory cell array 5 and dummy memory cell array 13 may receive pre-charge.

Subsequently, when detecting that the voltage of the dummy bit line DBL rises to a prescribed level, the internal control circuit 11 may determine that pre-charge by the pre-charge circuit 6 has been completed. Then, the internal control circuit 11 may lower the pre-charge control signal PRC to the low level, and stop the pre-charge circuit 6 and the dummy pre-charge circuit 14 from performing the pre-charge. Simultaneously, the internal control circuit 11 may activate the line and column decoders 3 and 4. Also, the sense amplifier 8, the input/output circuit 9, and the dummy sense amplifier 16 may receive an output of a prescribed control signal SEN and are activated by the internal control circuit 11. In addition, the internal control circuit 11 may output a write control signal WEN to the write buffer 10 and the dummy write buffer 17 in response to a write enable signal WEB that is externally input.

In addition, address data (output) from the address input circuit 2 may be decoded by the respective the line decoder 3 and the column decoder 4. The line decoder 3 may activate an applicable word line connected to an applicable memory cell MC designated by the address data. Further, the column decoder 4 may connect a bit line pair BL1 and BL1B connected to an applicable memory cell MC designated by the address data to the sense amplifier 8 and write buffer 10 via the data line pair DL and DLB through a column gate 7, respectively.

Further, the column decoder 4 may connect a dummy bit line pair DBL and DBLB of the dummy memory cell array 13 to the dummy sense amplifier 16 and dummy write buffer 17 via a dummy data line pair DDL and DDLB, respectively, through a dummy column gate 15. In this way, both of the applicable memory cell MC and dummy memory cell DMC corresponding to the applicable memory cell MC may be activated in the memory cell array 5 and the dummy memory cell array 13.

When data is to be read from the applicable memory cell MC, for example, a write enable signal WEB externally input may be at a high level, and a deactivation condition arises in the internal control circuit 11. Simultaneously, a control signal WEN of a low level may be output to and deactivate both the write buffer 10 and the dummy write buffer 17. In addition, a bit line pair BL1 and BL1B connected to the activated memory cell MC may be connected to the sense amplifier 8 via the data line pair DL1 and DL1B by a column gate 7 controlled by the column decoder 4. Data read and input to the sense amplifier 8 may be amplified and output to the input/output circuit 9, and then externally output through the output terminal DOUT.

Similarly, a dummy bit line pair DBL and DBLB connected to the activated dummy memory cell DMC may be connected to the dummy sense amplifier 16 through the dummy column gate 15 controlled by the column decoder 4 via the dummy data line pair DDL and DDLB. Data read and input to the dummy sense amplifier 16 may be amplified and output as a data signal DSO to the internal control circuit 11. Upon receiving an input of the data signal DSO, the internal control circuit 11 may deactivate each of the line decoder 3, the column decoder 4, the sense amplifier 8, the input/output circuit 9, the dummy sense amplifier 16, and the dummy write buffer 17. The internal control circuit 11 may simultaneously activate respective ones of the pre-charge circuit 6 and the dummy pre-charge circuit 14.

Figure 14:
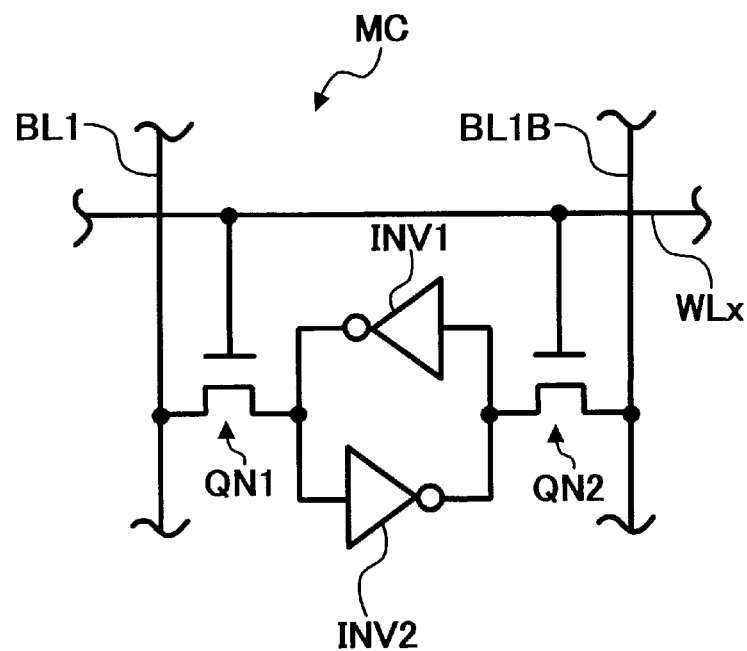
FIG. 14 illustrates an exemplary circuit of a memory cell MC of FIG. 13A.
Figure 15:
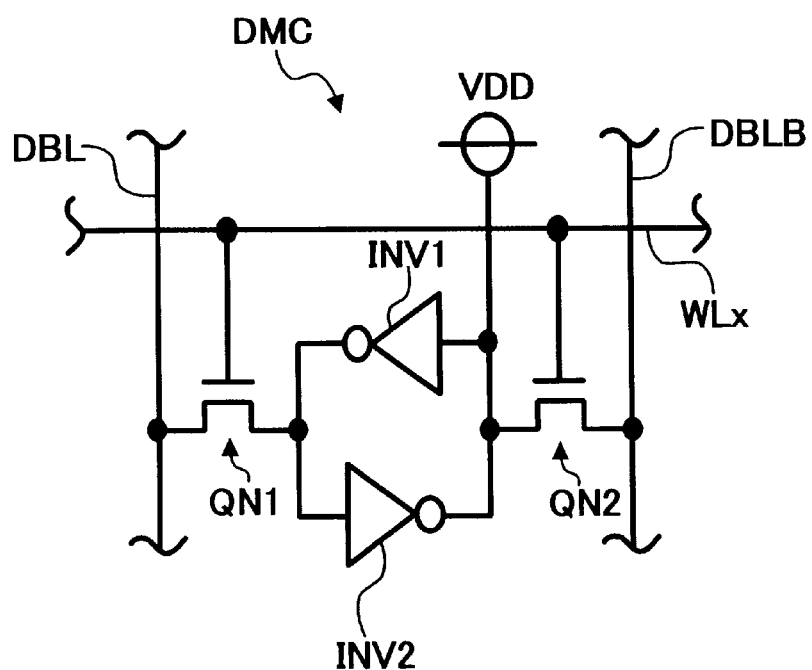
FIG. 15 illustrates an exemplary circuit of a dummy memory cell DMC of FIG. 13A.

Each of the respective pairs of the pre-charge circuit 6 and the dummy pre-charge circuit 14, the column gate 7 and the dummy column gate 15, the sense amplifier 8 and the dummy sense amplifier 16, and the write buffer 10 and the dummy write buffer 17 may have substantially the same circuit configuration as specifically described below. FIG. 14 illustrates an exemplary circuit of a memory cell MC. FIG. 15 illustrates an exemplary circuit of a dummy memory cell DMC. These drawings may illustrate respectively a memory cell MC and a dummy memory cell DMC connected to an optional word line WLx ($0 \leq x \leq m$) as an example.

In FIGS. 14 and 15, the memory cell MC and the dummy memory cell DMC may comprise a pair of inverters INV1 and INV2 forming flip/flops, and a pair of N-channel MOS type transistors (NMOS transistors) QN1 and QN2 whose gates are connected to the same word line and which serve as transfer gates for the flip/flops.

One terminal of the inverters INV1 and INV2 may be connected to the bit line BL1 via the NMOS transistor QN1 in the memory cell MC. The other may be connected to the bit line BL1B via the NMOS transistor QN2. In FIG. 15, one terminal of the inverters INV1 and INV2 may be connected to the dummy bit line DBL via the NMOS transistor QN1 in the dummy memory cell DMC. The other may receive a prescribed voltage such as electric power supply voltage VDD and is connected to the dummy bit line DBLB via the NMOS transistor QN2. Accordingly, the dummy bit line DBL may be at a low level and the dummy bit line DBLB may be at a high level when data in each dummy memory cell DMC is read.

Figure 16:
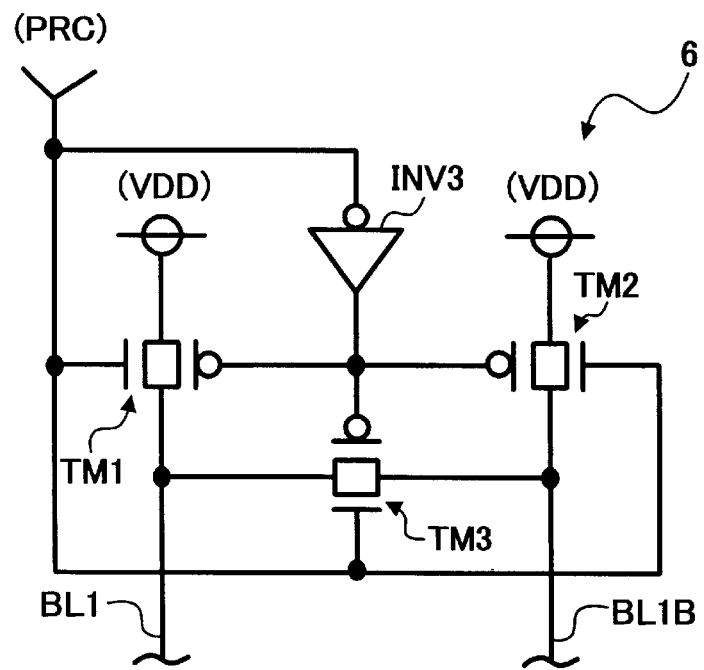
FIG. 16 illustrates an exemplary pre-charge circuit of FIG. 13A.

FIG. 16 illustrates an exemplary pre-charge circuit 6. As noted therefrom, a pair of gates TM1 to TM3 and an inverter INV3 may comprise the pre-charge circuit 6. A pre-charge control signal PRC from the internal control circuit 11 may be input to a gate of each NMOS transistor that form each of the transmission gates TM1 to TM3. Also, a pre-charge control signal PRC from the internal control circuit 11 may be input to each of P channel MOS type transistor (PMOS transistors) serving as transmission gates TM1 to TM3 via the inverter INV3.

The transmission gate TM1 may control an electric power supply voltage VDD to impress to a bit line BL1. The transmission gate TM1 may control an electric power supply voltage VDD to impress to a bit line BL1. The transmission gate TM2 may control an electric power supply voltage VDD to impress to a bit line BL1B. Further, the transmission gate TM3 may equalize the bit line pair BL1 and BL1B. Upon receiving an input of a high level signal ATD, for example, from the address input circuit 2, the internal control gate 11 may output a pre-charge control signal PRC of a high level and simultaneously monitor a voltage of a dummy bit line DBL by receiving an input from the detection circuit 18.

Each of the transmission gates TM1 to TM3 may be turned ON to be in a conductive condition, and pre-charge and equalization may be performed for each of the bit line pair BL1 and BL1B. When the voltage of the dummy bit line DBL rises to a prescribed level, the internal control circuit 11 may determine that the pre-charge has been completed by the pre-charge circuit 6, and change the pre-charge control signal PRC to the low level. Accordingly, each of the transmission gates TM1 to TM3 may be turned OFF to be a cut-off condition, each of the bit line pair BL1 and BL1B may stop receiving the pre-charge as well as equalization. The internal control circuit 11 may simultaneously stop the dummy pre-charge circuit 14 from pre-charging, similarly.

Figure 17:
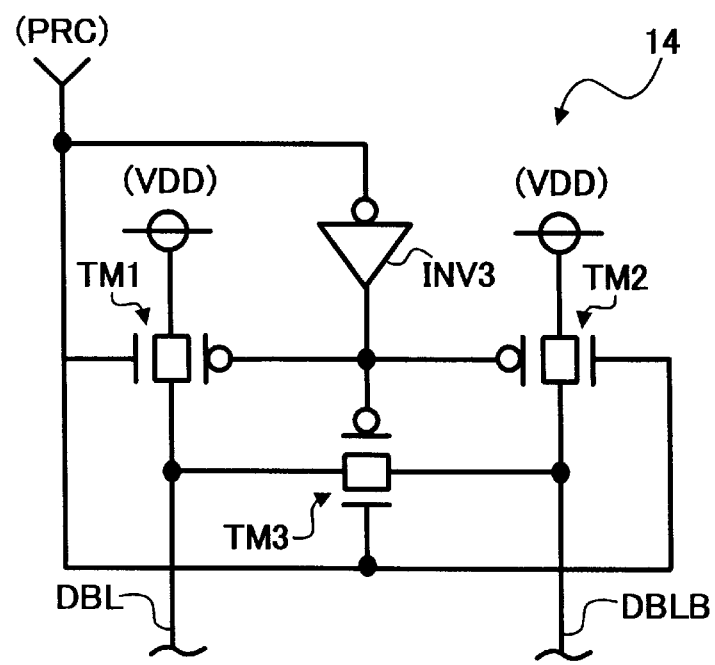
FIG. 17 illustrates an exemplary dummy pre-charge circuit of FIG. 13A.

Further, the internal control circuit 11 may output a pre-charge control signal PRC of the low level when the signal ATD from the address input circuit 2 is at the low level. In addition, each of the transmission gates TM1 to TM3 of the pre-charge circuit 6 may be turned OFF to be in a cut off condition, and both of the pre-charge and equalization for each of the bit line pair BL1 and BL1B may not be performed. FIG. 17 illustrates an exemplary dummy pre-charge circuit 14. However, the dummy pre-charge circuit 14 may be substantially the same as the pre-charge circuit of FIG. 16 except for that the bit line BL1 of FIG. 16 is replaced with a dummy bit line DBLB, and that the bit line BL1B thereof is replaced with a dummy bit line DBLB, explanation of those may be omitted.

Figure 18:
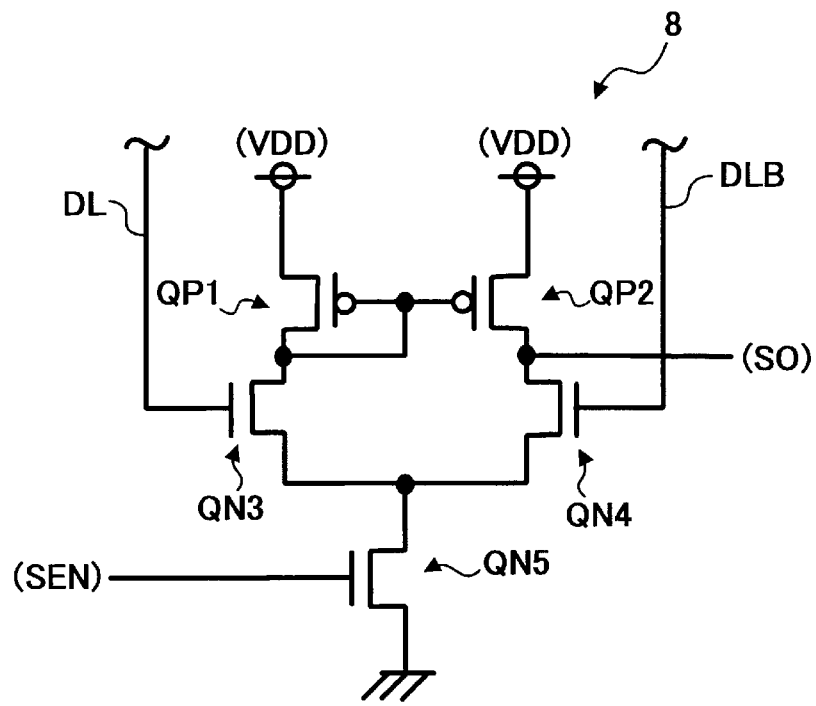
FIG. 18 illustrates an exemplary circuit of a sense amplifier of FIG. 13B.

FIG. 18 illustrates an exemplary circuit of a sense amplifier 8. As noted from FIG. 18, the sense amplifier 8 may include a pair of PMOS transistors QP1 and QP2 forming a current mirror circuit and a differential amplifier constituted by a pair of NMOS transistors QN3 to QN5. The electric power supply voltage VDD may be applied to each source, and the gates are connected to each other in the PMOS transistors QP1 and QP2. The gate connecting section may be connected to a drain of the QP1 PMOS transistor. Each drain of the QP1 and QP2 of the PMOS transistor may be connected to respective corresponding drain of the QN3 and QN4 of the NMOS transistors. Also, respective sources of the QN3 and QN4 of the NMOS transistors may be connected to each other. In addition, a NMOS transistor QN5 may be connected between the source connecting section and ground so as to serve as an electric power source.

The data lines DL and DLB may be connected to the gates of the NMOS transistors QN3 and QN4, respectively. A control signal SEN from the internal control circuit 11 may be input to the gate of the NMOS transistor QN5. A connecting section of the PMOS transistor QP2 and the NMOS transistor QN4 may serve as an output terminal of the sense amplifier 8. The output terminal may output an output signal SO to the input/output circuit 9. Upon receiving an input of a high level signal ATD from the address input circuit 2, the internal control circuit 11 may output an activation control signal SEN of a high level. Then, the NMOS transistor QN5 of the sense amplifier 8 may be activated and the sense amplifier 8 may enter into an operational condition.

Figure 19:
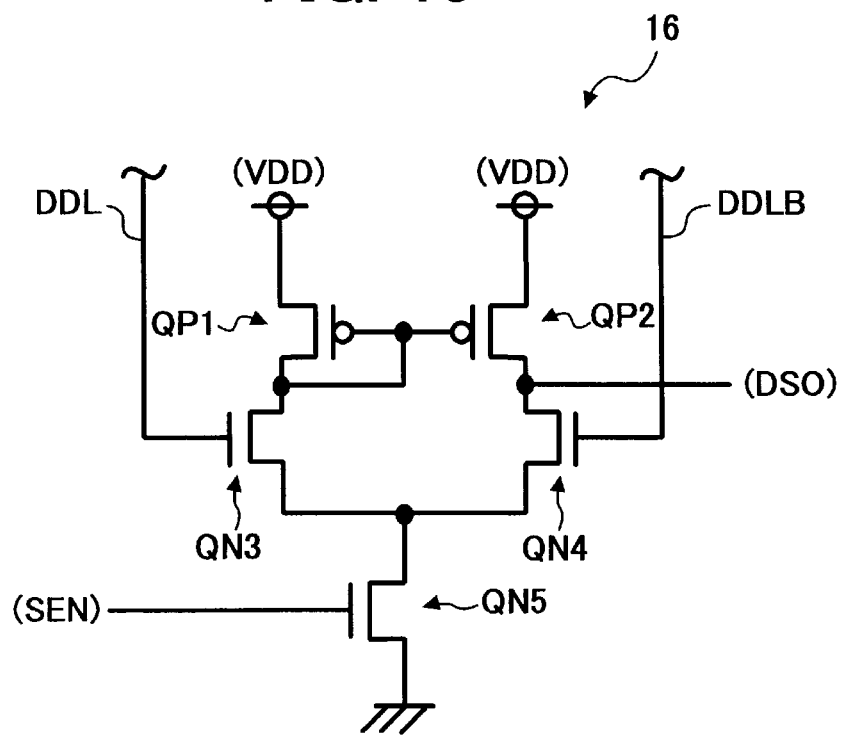
FIG. 19 illustrates an exemplary circuit of a dummy sense amplifier of FIG. 13B.
Figure 20:
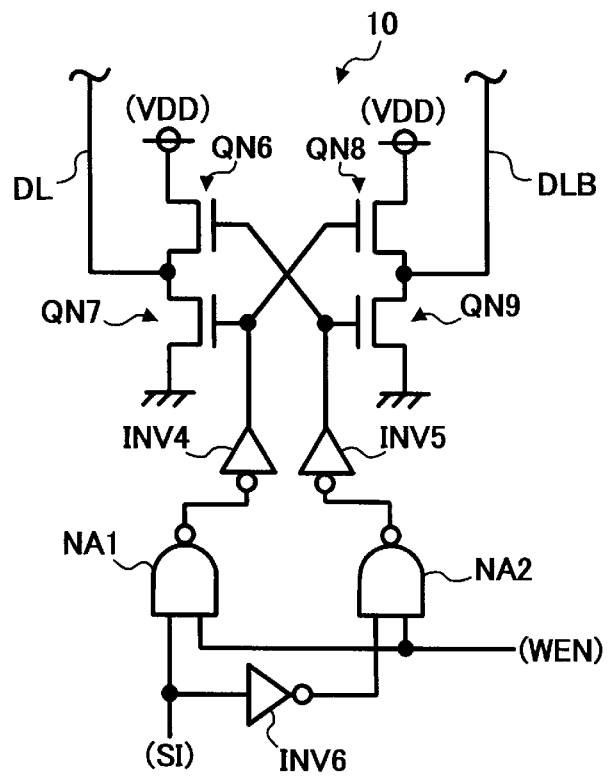
FIG. 20 illustrates an exemplary circuit of a write buffer of FIG. 13B.
Figure 21:
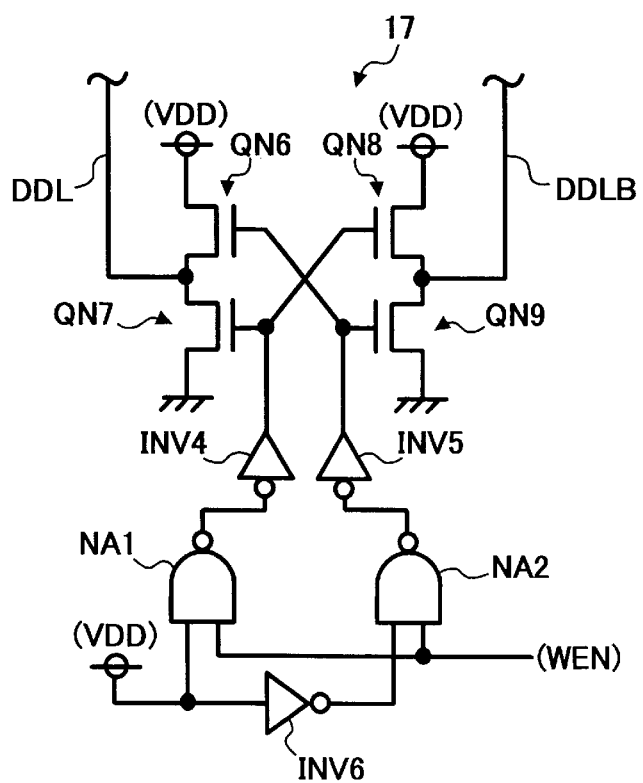
FIG. 21 illustrates an exemplary circuit of a dummy write buffer of FIG. 13B.

The internal control circuit 11 may change the activation control signal SEN to the low level when not receiving the signal ATD of the high level from the address input circuit 2. Accordingly, the NMOS transistor QN5 of the sense amplifier 8 may be deactivated and the sense amplifier 8 may stop operating. FIG. 19 illustrates an exemplary circuit of the dummy sense amplifier 14. The construction is substantially the same as that of FIG. 18 except that the data line DL of FIG. 18 is replaced with a dummy data line DDL, and the output signal SO of FIG. 18 is replaced with an output signal DSO input to the internal control circuit FIG. 20 illustrates an exemplary circuit of the write buffer 10. FIG. 21 illustrates an exemplary circuit of the dummy write buffer 20. As noted from FIG. 20, the write buffer 10 may include a plurality of NMOS transistors QN6 to QN9, a pair of NAND circuit NA1 and NA2, and a plurality of inverters INV1 to INV6. Between the electric power supply voltage VDD and ground, NMOS transistors QN6 and QN7 in series, and NMOS transistors QN8 to QN9 in series, may be connected in parallel. The pair of data lines DL and DLB may be connected to the connecting sections between the NMOS transistors QN6 and QN7, and QN8 and QN9, respectively.

A data signal SI input to the input/output circuit 9 may be input to one of input terminals of the NAND circuit NA1, and one of input terminals of the NAND circuit NA2 via the inverter INV6. To the other respective input terminals of the NAND circuits NA1 and NA2, a control signal WEN may be input from the internal control circuit. An output terminal of the NAND circuit NA1 may be connected to a connecting portion of the pair of gates of the NMOS transistors QN7 and QN8 via the inverter INV4. An output terminal of the NAND circuits NA2 may also be connected to a connecting portion of the pair of gates of the NMOS transistors QN6 and QN9 via the inverter INV5.

When a write enable signal WEB of a high level is input to the internal control circuit 11 and data reading is performed, the write buffer 10 may receive a control signal of a low level from the internal control circuit 11. Regardless of the data signal, each of the output terminals of the NAND circuits NA1 and NA2 may be brought to a high level. Thus, NMOS transistors QN6 to QN9 may be turned OFF to cut off conditions.

When a write enable signal WEB of a low level is input to the internal control circuit 11 and data writing is performed, the write buffer 10 may receive a control signal of a high level from the internal control circuit 11. Simultaneously, the output terminal of the NAND circuit NA1 may be brought to a signal level obtained by inverting the data signal SI output from the input/output circuit 9. The output terminal of the NAND circuit NA2 may be brought to substantially the same signal level as the data signal SI output from the input/output circuit 9. Thus, the data line DL may be brought to substantially the same voltage level as the data signal SI. The data line DLB may be brought to a voltage level obtained by inverting the data signal SI.

Instead of using the input data signal SI, an electric power supply voltage VDD may be applied. The dummy buffer 17 of FIG. 21 may have substantially the same construction except that the data line DL of FIG. 20 is replaced with a dummy data line DDL, and the data line DLB of FIG. 20 is replaced with a dummy data line DDLB. When data reading is performed, a control signal WEN output from the internal control circuit 11 may be brought to a low level, and each of the output terminals of the NAND circuits NA1 and NA2 of the dummy write buffer 17 may be brought to a high level. Thus, NMOS transistors QN6 to QN9 of the dummy write buffer 17 may be turned OFF to cut off conditions.

When data writing is performed, a control signal WEN output from the internal control circuit 11 may be brought to a high level, and the output terminal of the NAND circuit NA1 of the dummy write buffer 17 may be brought to a low level. At the same time, the output terminal of the NAND circuit NA2 may be brought to a high level. Thus, the dummy data line DDL and the dummy data line DDLB may be brought to a high level and a low level, respectively.

Figure 22:
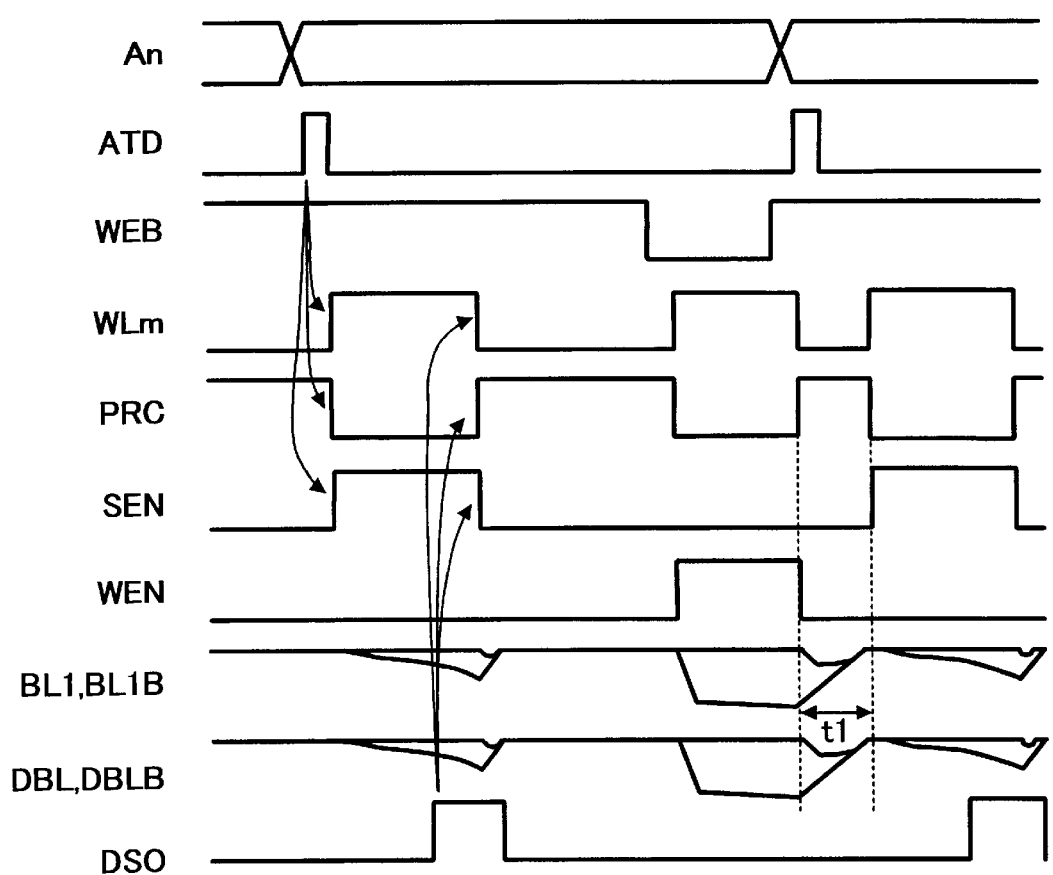
FIG. 22 is a timing chart for illustrating waveforms of respective sections of the semiconductor memory illustrated in FIGS. 13A and 13B.

FIG. 22 is a timing chart for illustrating various waveforms generated by various sections of the semiconductor memory 1 illustrated in FIG. 13. As noted from FIG. 22, upon receiving inputs of address data AO to An and a high level signal ATD, the internal control circuit 11 may initially output a pre-charge signal PRC of a high level to all of the pre-charge circuit 6 and the dummy pre-charge circuit 14 so as to pre-charge and bring respective voltages of bit lines and dummy bit line pair to initial conditions.

In such a situation, the internal control circuit 11 obtains and monitors a voltage of the dummy bit line DBL from the detection circuit 18 and then determines if pre-charge has been completed. Thus, the internal control circuit 11 may determine that a pre-charge time period may not exist including when data reading is repeated, namely data writing is not performed. Then, the line decoder 3 may immediately start selection of an appropriate word line in response to the charge up. This means that the line decoder 3 need not wait for a conventional charge up time period that is determined based upon a case when both the main and dummy bit line pairs are in the full swing conditions as a result of writing as illustrated by a timing chart portion of the bit line pair DBL and DBLB in FIG. 22. As a result, such data reading may be performed at a high speed. Also, transition to a deactivation condition of each section may be quickly performed in response thereto.

Subsequently, when an externally input write enable signal WEB used for entering into a data writing operation from a data reading operation changes from high to low levels, since data writing to an address designated by the address data AO to An should be performed, the line decoder 3 activated by the internal control circuit 11 may select a prescribed word line (e.g. a word line WLm in FIG. 13). Simultaneously, the internal control circuit 11 may bring the control signal WEN to a high level so as to activate. Then, the write buffer 10 may immediately bring the bit line pair BL1 and BL1B to a full-swing condition.

The dummy write buffer 17 may be similar to the dummy memory circuit 19. The dummy bit line pair DBL and DBLB may immediately come to the full-swing condition. A voltage of the dummy bit line DBL may be monitored by the internal control circuit 11. In this instance, it may be sufficient for the dummy write buffer 17 only to output prescribed complementary data to the dummy data line pair DDL and DDLB, respectively, so that substantially the same data with fixed data previously included in the dummy memory cell DMC can be written.

When address data AO to An changes and data reading is to be subsequently performed just after such a writing operation is completed, pre-charge is conventionally started before the dummy bit line pair comes to the full-swing condition. A conventional device does not include a writing function in a dummy section, and accordingly, the full swing condition does not exist in the dummy section when the main memory cell is written. In contrast, since the dummy write buffer is provided herein and the internal control circuit 11 precisely monitors a potential of the dummy bit line DBL in the semiconductor memory apparatus 1, a time period "t1" to be taken for pre-charging the bit line pair BL1 and BL1B is similarly assigned to pre-charging the dummy bit line pair DBL and DBLB. As a result, the internal control circuit 11 can avoid erroneous premature determination and precisely recognize completion of the pre-charge.

Figure 13A:
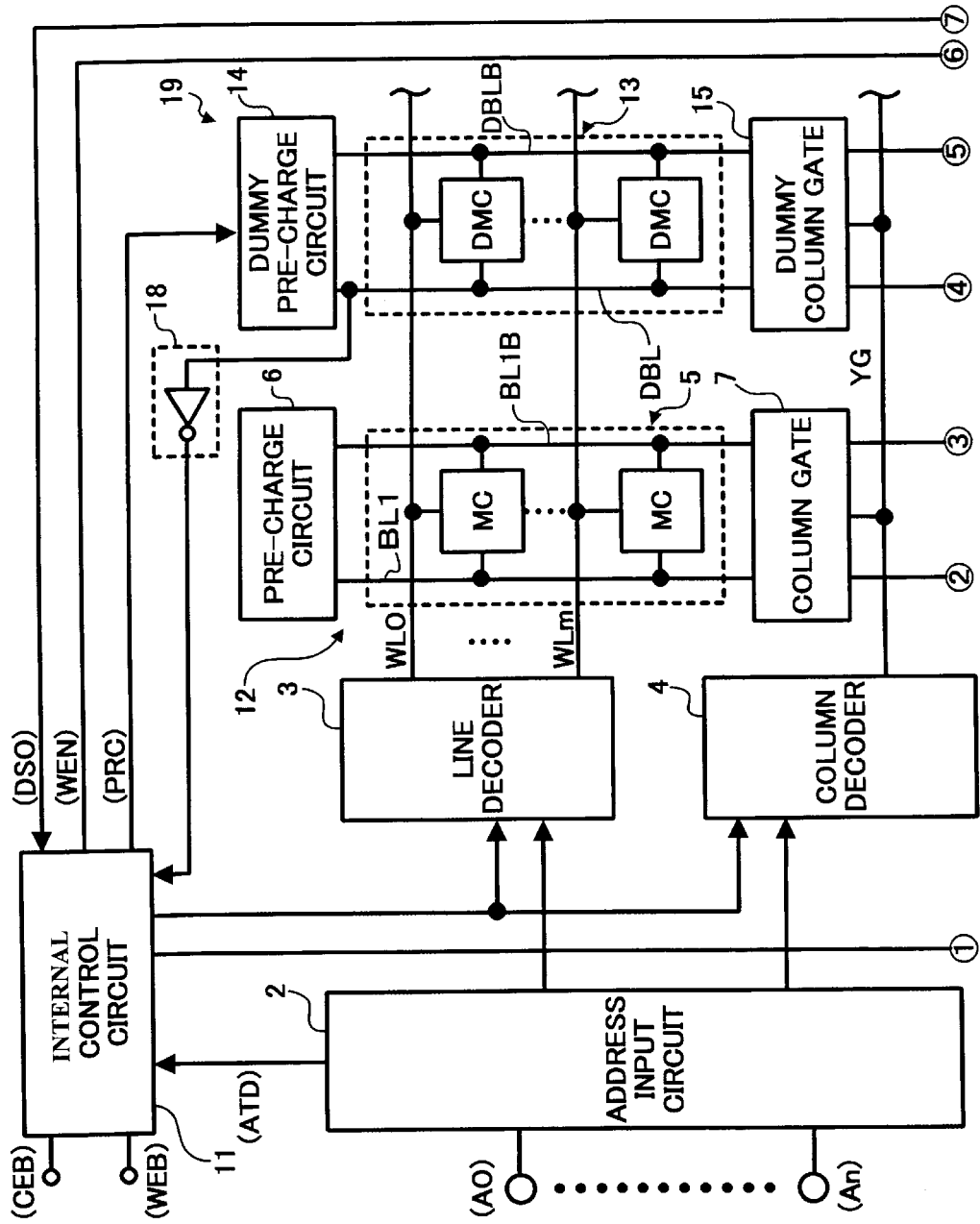
FIGS. 13A and 13B illustrate a third preferred embodiment of an exemplary semiconductor memory.
Figure 13B:
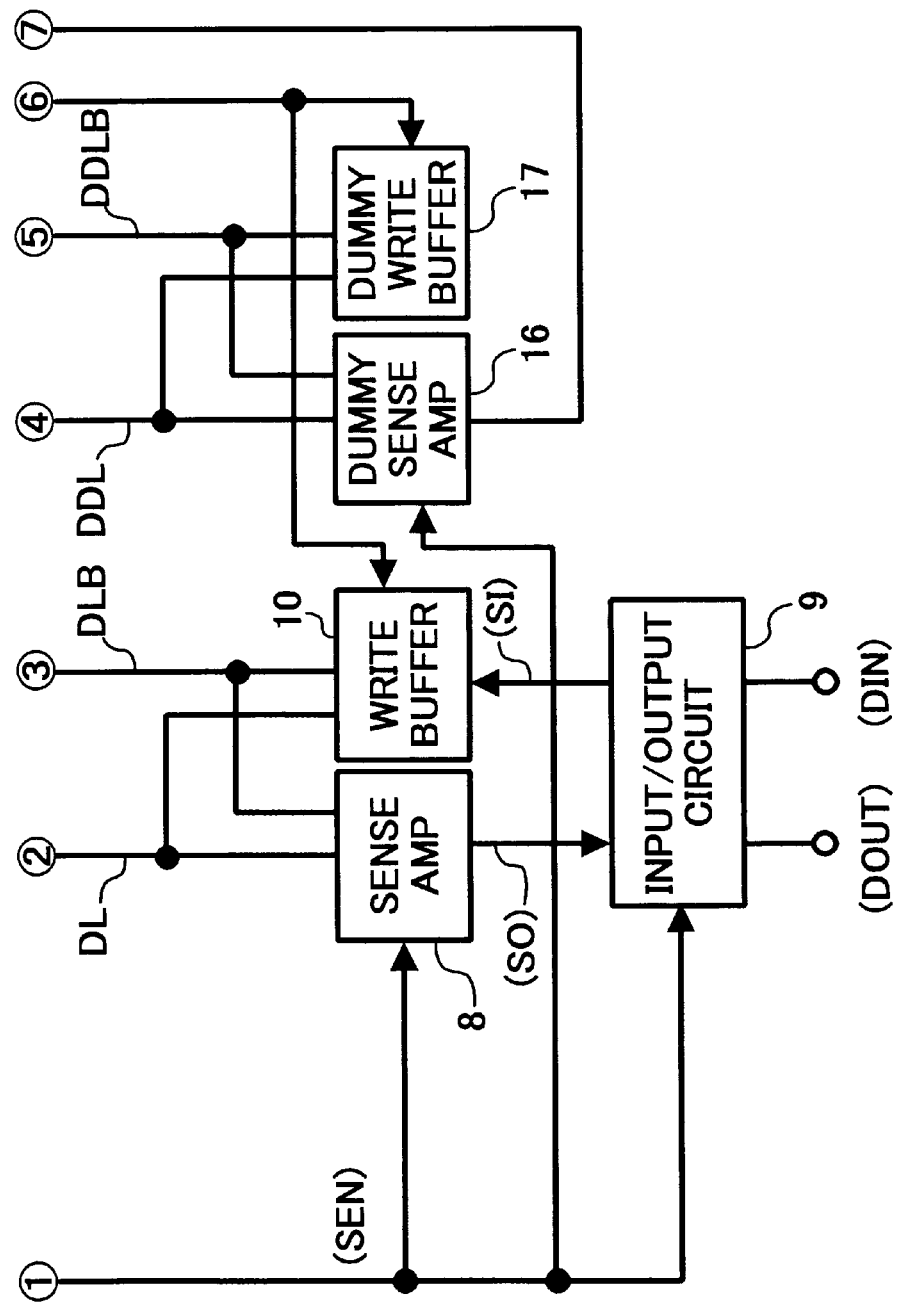
Figure 23A:
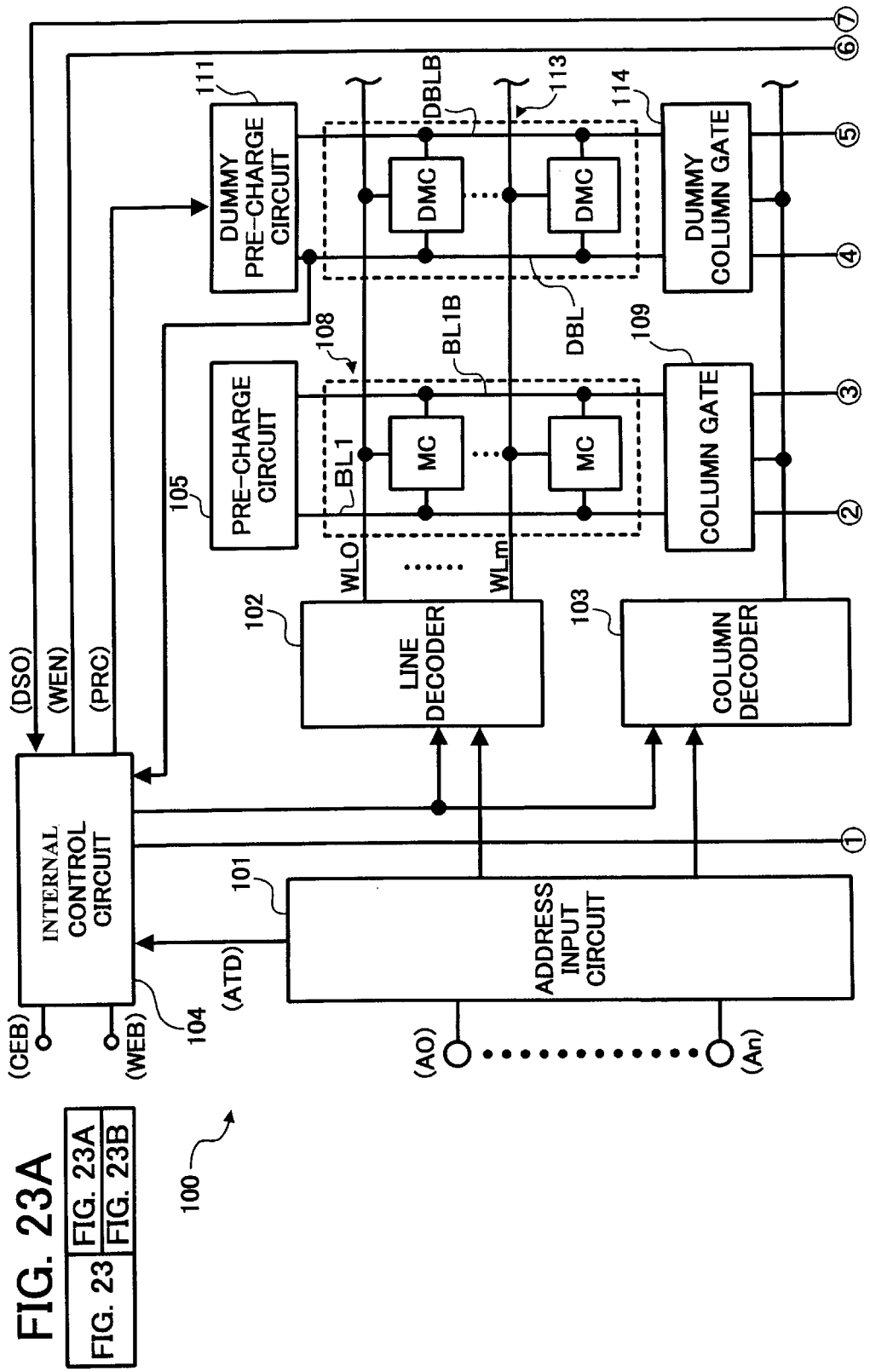
FIGS. 23A and 23B are block diagrams for illustrating another exemplary configuration of the first preferred embodiment.
Figure 23B:
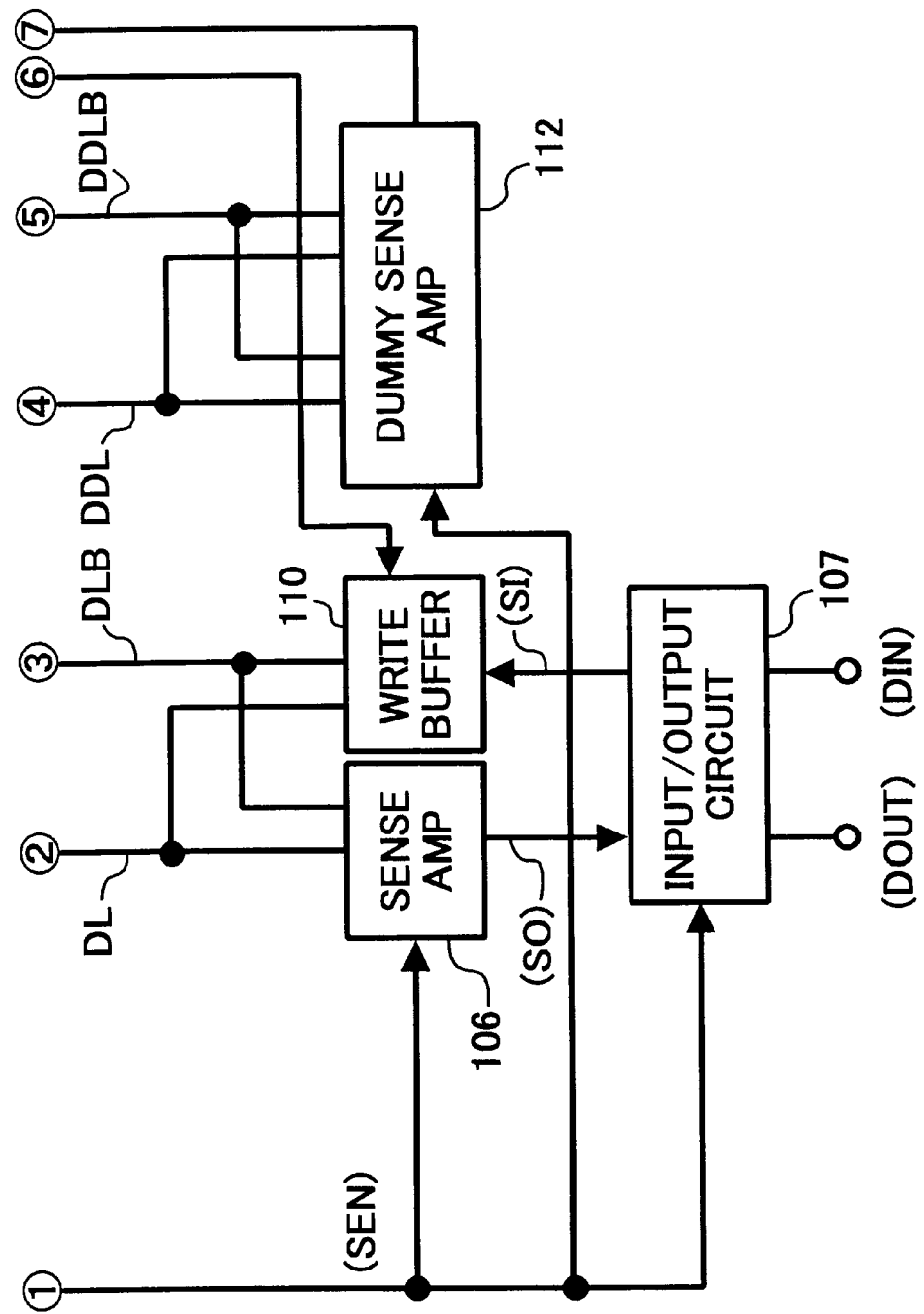
Figure 24:
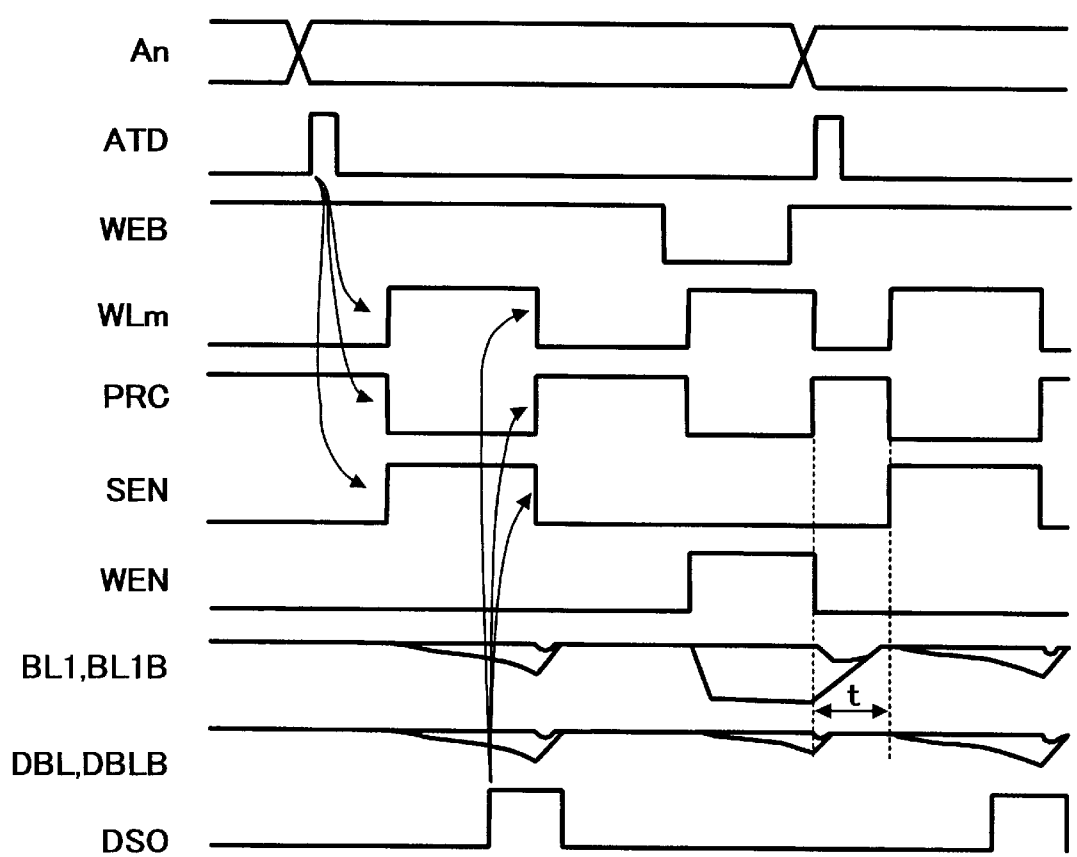
FIG. 24 is a timing chart for illustrating waveforms of respective sections of the semiconductor memory illustrated in FIGS. 23A and 23B.

FIGS. 23A and 23B illustrate another embodiment that is otherwise similar to that of FIGS. 13A and 13B but does not include detection circuit 18 of FIG. 13A. FIG. 24 illustrates relative timing of signals relevant to the operation of the memory illustrated in FIGS. 23A and 23B.

As described herein above, the semiconductor memory of this embodiment may provide a dummy write buffer 17 having a similar circuit configuration to that of the write buffer 10 of the dummy memory circuit 19. The dummy memory circuit 19 may have a similar circuit configuration to the memory circuit section 12 that writes and reads data. The internal control circuit 11 may detect a voltage of the dummy bit line DBL of the dummy memory circuit section 19 with the detection circuit 18, and determine completion of pre-charge so as to control pre-charge operations of the pre-charge circuit 6 and the dummy pre-charge circuit 14.

Thus, since a condition of the last data writing or reading is reliably simulated by the dummy write buffer, unlike a conventional system that sets a time period required when pre-charge is started from the full-swing condition of the bit line pair just after data writing as a pre-charge time period, the pre-charge may be performed for a time period in accordance with such a condition. Thus, a meaningless pre-charge time period may be decreased or deleted, and data reading may be performed at a high speed in a data reading cycle in which data reading continues.

In addition, when a data reading condition successively continues, such as image processing after data reading, an operation may be enabled in a high speed cycle. Thus, a great advantage can be obtained. Further, since the dummy bit line pair is in the full-swing conditions similar to the bit line pair in a data reading cycle just after data writing, pre-charge may be performed only for a necessary time period. In this way, since a pre-charge time period can vary in accordance with the last operational condition even in a case of performing substantially the same data reading, a meaningless operation may be decreased or omitted, and a high speed operation may be enabled.

In the above-described embodiment of the memory, the memory cell array includes one line of the memory cells as an example. However, the present disclosure is not limited thereto, and the memory cell array can have plural lines thereof. In addition, tail end codes "B" of a signal and a data line may represent inversion of a signal level (i.e., a low active).

The mechanisms and processes set forth herein may be implemented using one or more conventional general purpose microprocessors and/or signal processors programmed according to the teachings in the present specification as will be appreciated by those skilled in the relevant arts. Appropriate software coding can readily be prepared by skilled programmers based on the teachings of the present disclosure, as will also be apparent to those skilled in the relevant arts. However, as will be readily apparent to those skilled in the art, the present invention also may be implemented by the preparation of application-specific integrated circuits by interconnecting an appropriate network of conventional component circuits or by a combination thereof with one or more conventional general purpose microprocessors and/or signal processors programmed accordingly. The present invention thus also includes a computer-based product which may be hosted on a storage medium and include, but is not limited to, any type of disk including floppy disks, optical disks, CD-ROMs, magnet-optical disks, ROMs, RAMs, EPROMs, EEPROMs, flash memory, magnetic or optical cards, or any type of media suitable for storing electronic instructions.

Numerous additional modifications and variations of the present invention are possible in light of the above teachings. It is therefore to be understood that within the scope of the appended claims, the present invention may be practiced otherwise than as specifically described herein.

This application claims priority under 35 USC §119 to Japanese Patent Application Nos. 2001-041185 and 2001-060172 filed on Feb. 19, 2001, and Mar. 5, 2001, respectively, the entire contents of which are herein incorporated by reference.

What is claimed as new and desired to be secured by letter patent of the United States is:

1. A semiconductor memory comprising:
   a memory array configured to include a plurality of memory cells;
   a bit line pair configured to input and output complementary data to and from each of the plurality of memory cells;
   a pre-charge circuit configured to pre-charge the bit line pair when data reading is performed;
   a sense amplifier configured to amplify a potential difference of the bit line pair;
   a dummy memory circuit configured to simulate dummy data reading from an applicable dummy memory cell when the data reading is performed, said dummy memory circuit including a plurality of dummy memory cells configured to be selected together with a corresponding memory cell for reading, said dummy memory cell including pre-fixed complementary data;
   a dummy bit line pair connected to each of the dummy memory cells;
   a dummy pre-charge circuit configured to pre-charge the dummy bit line pair when the data reading is performed;
   a dummy sense amplifier configured to amplify a potential difference of the dummy bit line pair, said dummy sense amplifier outputting a control signal for controlling the semiconductor memory when said potential difference is at a prescribed level; and
   wherein said dummy pre-charge circuit provides the dummy bit line pair with respective charge amounts oppositely corresponding to the complementary data when data reading is performed.

2. The semiconductor memory according to claim 1, wherein an output timing of said control signal is delayed in accordance with an amount of the potential difference of the dummy bit line pair.

3. The semiconductor memory according to claim 1, said dummy pre-charge circuit includes PMOS and NMOS type transistors at both sides of the dummy bit line pair, said PMOS and NMOS type transistors generating a difference in a pre-charge potential of the bit line pair.

4. A semiconductor memory comprising:
   a memory array configured to include a plurality of memory cells;
   a bit line pair configured to input and output complementary data to and from each of the memory cells;
   a pre-charge circuit configured to pre-charge the bit line pair when data reading is performed;
   a sense amplifier configured to amplify a potential difference of the bit line pair;
   a dummy memory circuit configured to simulate dummy data reading from an applicable dummy memory cell when the data reading is performed, said dummy memory circuit including a plurality of dummy memory cells configured to be simultaneously selected together with a corresponding memory cell for reading, said dummy memory cells including pre-fixed complementary data;
   a dummy bit line pair connected to each of the dummy memory cells;
   a dummy sense amplifier configured to amplify a potential difference of the dummy bit line pair, said dummy sense amplifier outputting a control signal for controlling the semiconductor memory when said potential difference of the dummy bit line pair is at a prescribed level;
   a dummy pre-charge circuit configured to pre-charge the dummy bit line pair when the data reading is performed; and
   a potential lowering circuit disposed between one of the lines of said dummy bit line pair and the dummy sense amplifier and configured to lower a potential of the one of the lines of the dummy bit line pair so as to temporary create a prescribed difference in potential of the dummy bit line pair.

5. The semiconductor memory according to claim 4, wherein said potential lowering circuit includes a parasitic capacitance having a grounded terminal.

6. The semiconductor memory according to claim 4, wherein said potential lowering circuit includes a transistor having a gate connected to receive a potential lowering signal and further having a grounded terminal.

7. The semiconductor memory according to any one of claims 1 and 4, wherein said control signal controls the sense amplifier activation.

8. The semiconductor memory according to any one of claims 1 and 4, wherein said control signal controls a word line activation so as to select a prescribed memory cell.

9. The semiconductor memory apparatus according to claim 8, wherein each of said dummy memory cells includes a complementary signal.

10. A semiconductor memory comprising:
    a memory array configured to include a plurality of memory cells;
    at least one bit line pair configured to input and output a complementary signal to and from a prescribed memory cell;
    at least one word line configured to convey an activation control signal to at least one applicable memory cell;
    a pre-charge circuit configured to pre-charge a prescribed bit line pair when data reading is performed;
    a sense amplifier configured to amplify a potential difference of the bit line pair when data reading is performed from an applicable memory cell;

a write buffer configured to write data to an applicable memory cell via an applicable bit line pair when data writing is performed;

a dummy memory cell array configured to include a plurality of dummy memory cells each having substantially the same configuration as a corresponding memory cell and connected thereto via a word line, said dummy memory cell array simulating both reading and writing to and from the dummy memory cell;

a dummy bit line pair configured to input and output a complementary signal to and from an applicable dummy memory cell;

a dummy write buffer configured to simulate data writing to an applicable dummy memory cell;

a dummy pre-charge circuit configured to equally pre-charge the dummy bit line pair;

a dummy memory circuit configured to simulate data reading from a dummy memory cell;

a potential condition detecting circuit configured to detect a potential of one of the lines of the dummy bit line pair; and a control section configured to determine the pre-charge condition based upon the detected potential and control the pre-charge circuit and the dummy pre-charge circuit to start operating.

11. The semiconductor memory apparatus according to any one of claims 10 and 9, wherein said dummy memory circuit includes a dummy sense amplifier configured to amplify a potential difference of the dummy bit line pair when data reading is performed and output a control signal for controlling the semiconductor memory, and wherein said control section controls the word line and the sense amplifier of the memory circuit section to activate based upon the control signal.

12. The semiconductor memory apparatus, according to claim 10, wherein said dummy memory cell receives a prescribed amount of voltage so as to store and hold the complementary data.

* * * * *